(12) United States Patent
Lee

(10) Patent No.: US 8,787,060 B2
(45) Date of Patent: Jul. 22, 2014

(54) METHOD AND APPARATUS FOR OPTIMIZING DRIVER LOAD IN A MEMORY PACKAGE

(75) Inventor: Hyun Lee, Ladera Ranch, CA (US)

(73) Assignee: Netlist, Inc., Irvine, CA (US)

( * ) Notice: Subject to any disclaimer, the term of this patent is extended or adjusted under 35 U.S.C. 154(b) by 103 days.

(21) Appl. No.: 13/288,850

(22) Filed: Nov. 3, 2011

(65) Prior Publication Data

US 2012/0106228 A1    May 3, 2012

Related U.S. Application Data

(60) Provisional application No. 61/409,893, filed on Nov. 3, 2010.

(51) Int. Cl.
*G11C 5/06* (2006.01)

(52) U.S. Cl.
USPC .............................................. 365/63; 365/51

(58) Field of Classification Search
USPC .............................................. 365/63, 51, 52
See application file for complete search history.

(56) References Cited

U.S. PATENT DOCUMENTS

| | | | |
|---|---|---|---|
| 6,243,283 B1 | 6/2001 | Bertin et al. |
| 6,551,857 B2 | 4/2003 | Leedy |
| 7,098,541 B2 | 8/2006 | Adelmann |
| 7,200,021 B2 | 4/2007 | Raghuram |
| 7,254,036 B2 | 8/2007 | Pauley et al. |
| 7,269,042 B2 | 9/2007 | Kinsley et al. |
| 7,286,436 B2 | 10/2007 | Bhakta et al. |
| 7,289,386 B2 | 10/2007 | Bhakta et al. |
| 7,375,970 B2 | 5/2008 | Pauley et al. |
| 7,442,050 B1 | 10/2008 | Bhakta et al. |
| 7,532,537 B2 | 5/2009 | Solomon et al. |
| 7,619,893 B1 | 11/2009 | Yu |
| 7,619,912 B2 | 11/2009 | Bhakta et al. |
| 7,630,202 B2 | 12/2009 | Pauley et al. |

(Continued)

FOREIGN PATENT DOCUMENTS

| | | |
|---|---|---|
| EP | 1 816 570 A2 | 8/2007 |
| WO | WO 2010-138480 | 12/2010 |
| WO | WO 2011-049710 | 4/2011 |
| WO | WO 2011-094437 | 8/2011 |

OTHER PUBLICATIONS

International Search Report and Written Opinion, PCT/US2011/059209, Jan. 31, 2013.

(Continued)

*Primary Examiner* — Huan Hoang
(74) *Attorney, Agent, or Firm* — Jamie J. Zheng, Esq.

(57) ABSTRACT

An apparatus is provided that includes a plurality of array dies and at least two die interconnects. The first die interconnect is in electrical communication with a data port of a first array die and a data port of a second array die and not in electrical communication with data ports of a third array die. The second die interconnect is in electrical communication with a data port of the third array die and not in electrical communication with data ports of the first array die and the second array die. The apparatus includes a control die that includes a first data conduit configured to transmit a data signal to the first die interconnect and not to the second die interconnect, and at least a second data conduit configured to transmit the data signal to the second die interconnect and not to the first die interconnect.

34 Claims, 8 Drawing Sheets

(56) References Cited

U.S. PATENT DOCUMENTS

| | | | |
|---|---|---|---|
| 7,633,165 | B2 | 12/2009 | Hsu et al. |
| 7,636,274 | B2 | 12/2009 | Solomon et al. |
| 7,683,459 | B2 | 3/2010 | Ma et al. |
| 7,811,097 | B1 | 10/2010 | Bhakta et al. |
| 7,827,348 | B2 | 11/2010 | Lee et al. |
| 7,830,692 | B2 | 11/2010 | Chung et al. |
| 7,839,645 | B2 | 11/2010 | Pauley et al. |
| 7,864,627 | B2 | 1/2011 | Bhakta et al. |
| 7,881,150 | B2 | 2/2011 | Solomon et al. |
| 7,894,229 | B2 | 2/2011 | Lahtinen et al. |
| 7,894,230 | B2 | 2/2011 | Kim |
| 7,978,721 | B2 | 7/2011 | Jeddeloh et al. |
| 7,990,171 | B2 | 8/2011 | Chung et al. |
| 7,999,367 | B2 | 8/2011 | Kang et al. |
| 8,001,434 | B1 | 8/2011 | Lee et al. |
| 8,019,589 | B2 | 9/2011 | Rajan et al. |
| 8,033,836 | B1 | 10/2011 | Bhakta et al. |
| 2006/0233012 | A1 | 10/2006 | Sekiguchi et al. |
| 2006/0259678 | A1* | 11/2006 | Gervasi ............... 711/2 |
| 2007/0096332 | A1 | 5/2007 | Satoh et al. |
| 2008/0025123 | A1 | 1/2008 | Rajan et al. |
| 2008/0025137 | A1* | 1/2008 | Rajan et al. ........... 365/239 |
| 2008/0094808 | A1 | 4/2008 | Kanapathippillai et al. |
| 2008/0253085 | A1 | 10/2008 | Soffer |
| 2008/0296779 | A1 | 12/2008 | Matsui et al. |
| 2009/0070727 | A1 | 3/2009 | Solomon |
| 2009/0103345 | A1 | 4/2009 | McLaren et al. |
| 2009/0290442 | A1 | 11/2009 | Rajan |
| 2010/0020583 | A1 | 1/2010 | Kang et al. |
| 2010/0090338 | A1 | 4/2010 | Lee et al. |
| 2010/0174858 | A1 | 7/2010 | Chen et al. |
| 2011/0006360 | A1 | 1/2011 | Ikebuchi |
| 2011/0016250 | A1 | 1/2011 | Lee et al. |
| 2011/0016269 | A1 | 1/2011 | Lee et al. |
| 2011/0050320 | A1 | 3/2011 | Gillingham |
| 2011/0108888 | A1 | 5/2011 | Or-Bach et al. |
| 2011/0125982 | A1 | 5/2011 | Choi et al. |
| 2011/0156232 | A1 | 6/2011 | Youn et al. |
| 2011/0169171 | A1 | 7/2011 | Marcoux |
| 2011/0193226 | A1* | 8/2011 | Kirby et al. ........... 257/738 |

OTHER PUBLICATIONS

Ahmad et al., "Modeling of peak-to-peak switching noise along a vertical chain of power distribution TSV pairs in a 3D stack of ICs interconnected through TSVs," Norchip Conference, Article No. 5669473, Nov. 15-16, 2010, IEEE Computer Society.

Black et al., "Die Stacking (3D) Microarchitecture," MICRO-39, 39th Annual IEEE/ACM International Symposium on, Dec. 2006, 469-479, Orlando, FL.

Daneshtalab et al., "CMIT—A novel cluster-based topology for 3D stacked architectures," 3D Systems Integration Conference (3DIC), 2010 IEEE International, Nov. 16-18, 2010, pp. 1-5.

Funaya et al., "Cache partitioning strategies for 3-D stacked vector processors," IEEE 3D System Integration Conference, article No. 5751453, Nov. 16-18, 2010, IEEE Computer Society.

Ghosh et al., "Smart Refresh: An Enhancement Memory Controller Design for Reducing Energy in Conventional and 3D Die-Stacked DRAMs," Microarchitecture, 2007, 40th Annual IEEE/ACM International Symposium, Dec. 1-5, 2007, pp. 134-145.

Kang et al., "8 Gb 3-D DDR3 DRAM using through-silicon-via technology," IEEE Journal of Solid-State Circuits, v 45, n. 1, 111-19, Jan. 2010, IEEE, USA.

U.S. Appl. No. 12/422,912, filed Apr. 13, 2009, Hyun Lee, et al.

U.S. Appl. No. 12/422,853, filed Apr. 13, 2009, Hyun Lee, et al.

U.S. Appl. No. 12/815,339, filed Jun. 14, 2010, Hyun Lee.

Kang et al., "Signal integrity and reliability of a new Multi-Stack Package using a Pressure Conductive Rubber," Electrical Design of Advanced Packaging and Systems Symposium, 214-17, Dec. 2008, Seoul, South Korea.

Kawano, "A 3D Packaging Technology for High-Density Stacked DRAM," VLSI Technology, Systems and Applications, 2007, Apr. 23-25, 2007, pp. 1-2.

Kurita et al., "A 3-D packaging technology with highly-parallel memory/logic interconnect," IEICE Transactions on Electronics, v E92-C, No. 12, pp. 1512-1522, 2009, Maruzen Col, Ltd.

Kurita et al., "Vertical Integration of Stacked DRAM and High-Speed Logic Device Using SMAFTI Technology," Advanced Packaging, IEEE Transactions, Aug. 2009, vol. 32 Issue 3, pp. 657-665.

"Posts Tagged '3D Stacking'," from Chip Design Mag., http://chipdesignmag.com/lpd/blog/tag/3d-stacking/ (Printed Oct. 13, 2011).

Russell, Gill, "Intel Micron Hybrid Memory Cube: The Future of Exascale Computing," Bright Side of News. Sep. 19, 2011, <http://www.brightsideofnews.com/news/2011/9/19/intel-micron-hybrid-memory-cube-the-future-of-exascale-computing.aspx> Printed Oct. 13, 2011 in 8 pages.

Loh, "3D-Stacked Memory Architectures for Multi-core Processors," Proceedings of the 35th Annual International Symposium on Computer Architecture (ISCA '08), 453-464, IEEE Computer Society, Washington DC, USA.

Val, "The 3D interconnection applications for mass memories and microprocessors," Proceedings of the Technical Conference, 1991 International Electronic Packaging Conference, 851-60, vol. 2, 1991, Int. Electron. Packaging Soc, Wheaton, IL, USA, 2008.

Weis et al., "Design space exploration for 3D-stacked DRAMs," Proceedings—Design, Automation and Test in Europe Conference and Exhibition, 2011.

Zhang et al. "A Customized Design of DRAM Controller for On-Chip 3D DRAM Stacking" Custom Integrated Circuits Conference (CICC), 2010 IEEE, Sep. 19-22, 2010, pp. 1-4.

* cited by examiner

METHOD AND APPARATUS FOR OPTIMIZING DRIVER LOAD IN A MEMORY PACKAGE

RELATED APPLICATION

This application claims the benefit of priority under 35 U.S.C. §119(e) of U.S. Provisional Patent Application No. 61/409,893, filed on Nov. 3, 2010, and entitled "ARCHITECTURE FOR MEMORY MODULE WITH PACKAGES OF THREE-DIMENSIONAL STACKED (3DS) MEMORY CHIPS," the disclosure of which is hereby incorporated by reference in its entirety.

BACKGROUND

1. Technical Field

The present disclosure relates to memory devices and memory modules. More specifically, the present disclosure relates to systems and methods for reducing the load of drivers of memory packages included on the memory modules.

2. Description of the Related Art

Memory modules may include a number of memory packages. Each memory package may itself include a number of array dies that are packaged together. Each array die may include an individual semiconductor chip that includes a number of memory cells. The memory cell may serve as the basic building block of computer storage representing a single bit of data.

FIGS. 1A and 1B schematically illustrate examples of existing memory package designs currently used or proposed to be used to provide the dynamic random-access memory of memory modules. FIG. 1A schematically illustrates a memory package 100 with three array dies 110 and a control die 130. The control die 130 is configured to respond to signals received by the memory package 100 by sending appropriate control signals to the array dies 110 and includes a driver 134 for driving data signals to each of the array dies 110 via a corresponding die interconnect 120. Further, the control die 130 includes a driver 140 for driving command and/or address signals to each of the array dies 110 via another corresponding die interconnect 142. For simplicity, FIG. 1A shows only a single driver 134, die interconnect 120, driver 140, and die interconnect 142. However, additional drivers and die interconnects may be included for each bit the memory package 100 is designed to support. Thus, a 16-bit memory may include 16 pairs of drivers and die interconnects for the data signals and other similar drivers and die interconnects for the command and/or address signals. Each array die 110 also includes a chip select port 144, with the chip select ports 144 of the array dies 110 configured to receive corresponding chip select signals to enable or select the array dies for data transfer. The array dies 110 are configured to transfer data (e.g. read or write) to or from the selected memory cells identified by the command, address, and chip select signals via the die interconnects.

In some cases, the control die 130 may include memory cells and therefore, also serve as an array die. Thus, as can be seen from FIG. 1A, the control die 130 may also include a chip select port 144. Alternatively, the control die 130 and the array dies 110 may be distinct elements and the control die 130 may not include any memory cells.

FIG. 1B schematically illustrates an example of a memory package 150 that includes four array dies 160 and a control die 170 that does not include memory cells. As can be seen in FIG. 1B, each array die 160 includes a chip select port 174. However, because the control die 170 does not also serve as an array die, the control die 170 does not include a chip select port. As with memory package 100, memory package 150 includes a driver 184 that drives data signals to each of the array dies 160 along a corresponding die interconnect 182. Further, the memory package 150 includes a driver 186 for driving command and/or address signals to each of the array dies 160 via another die interconnect 188.

Generally, a load exists on each of the drivers 134, 140, 184, and 186 by virtue of the drivers being in electrical communication with the corresponding die interconnects and the corresponding circuitry of the array dies. Thus, to drive a signal along a die interconnect, a driver typically must be large enough to overcome the load on the driver. However, generally a larger driver not only consumes more space on the control die, but also consumes more power.

SUMMARY

In certain embodiments, an apparatus is provided that comprises a plurality of array dies having data ports. The apparatus further comprises at least a first die interconnect and a second die interconnect. The first die interconnect is in electrical communication with at least one data port of a first array die of the plurality of array dies and at least one data port of a second array die of the plurality of array dies and not in electrical communication with the data ports of at least a third array die of the plurality of array dies. The second die interconnect is in electrical communication with at least one data port of the third array die and not in electrical communication with the data ports of the first array die and the data ports of the second array die. In addition, the apparatus comprises a control die. The control die comprises at least a first data conduit configured to transmit a data signal to the first die interconnect and to not transmit the data signal to the second die interconnect, and at least a second data conduit configured to transmit the data signal to the second die interconnect and to not transmit the data signal to the first die interconnect.

In certain embodiments, an apparatus is provided that comprises a plurality of array dies having ports. The apparatus further comprises at least a first die interconnect and a second die interconnect. The first die interconnect is in electrical communication with at least one port of a first array die of the plurality of array dies and at least one port of a second array die of the plurality of array dies and not in electrical communication with the ports of at least a third array die of the plurality of array dies. The second die interconnect is in electrical communication with at least one port of the third array die and not in electrical communication with the ports of the first array die and the ports of the second array die. In addition, the apparatus comprises a control die. The control die comprises at least a first conduit configured to transmit a signal to the first die interconnect and to not transmit the signal to the second die interconnect, and at least a second conduit configured to transmit the signal to the second die interconnect and to not transmit the signal to the first die interconnect. Moreover, a first load on the first conduit comprises a load of the first die interconnect, a load of the first array die, and a load of the second array die. In addition, a second load on the second conduit comprises a load of the second die interconnect and a load of the third array die.

In certain embodiments, a method is provided for optimizing load in a memory package. The memory package comprises a plurality of array dies, at least a first die interconnect and a second die interconnect, and a control die. The control die comprises at least a first driver and a second driver, the first driver configured to drive a signal along the first die interconnect, and the second driver configured to drive the signal along the second die interconnect. The method comprises selecting a first subset of array dies of the plurality of array dies and a second subset of array dies of the plurality of array dies. The first subset of array dies and the second subset of array dies are exclusive of one another and are selected to balance a load on the first driver and on the second driver based at least in part on array die loads of array dies of the plurality of array dies and at least in part on die interconnect segment loads of segments of at least the first die interconnect and the second die interconnect. The method further comprises forming electrical connections between the first die interconnect and the first subset of array dies. In addition, the method comprises forming electrical connections between the second die interconnect and the second subset of array dies.

In certain embodiments, an apparatus is provided that comprises a register device configured to receive command/address signals from a memory control hub and to generate data path control signals. The apparatus further comprises a plurality of DRAM packages. Each of the DRAM packages comprises a control die. The control die comprises a plurality of command/address buffers and a data path control circuit configured to control command/address time slots and data bus time slots. The control die is configured to receive data signals from the memory control hub, the data path control signals from the register device, and command/address signals from the register device. Further, each of the DRAM packages comprises a plurality of DDR DRAM dies operatively coupled to the control die to receive the data signals from the control die. Moreover, the memory module is selectively configurable into at least two operational modes. The two operational modes comprise a first operational mode and a second operational mode. In the first operational mode the register device generates the data path control signals, and the control die uses the data path control signals to operate the data path control circuit. In the second operational mode, the control die operates the data path control circuit to provide the command/address signals to the plurality of DDR DRAM dies without decoding the command/address signals.

BRIEF DESCRIPTION OF THE DRAWINGS

Throughout the drawings, reference numbers are re-used to indicate correspondence between referenced elements. The drawings are provided to illustrate certain example embodiments of the inventive subject matter described herein and not to limit the scope thereof.

DETAILED DESCRIPTION OF SPECIFIC EMBODIMENTS

In addition to the below, the following U.S. patents are incorporated in their entirety by reference herein: U.S. Pat. Nos. 7,289,386, 7,286,436, 7,442,050, 7,375,970, 7,254,036, 7,532,537, 7,636,274, 7,630,202, 7,619,893, 7,619,912, 7,811,097. Further, the following U.S. patent applications are incorporated in their entirety by reference herein: U.S. patent application Ser. Nos. 12/422,912, 12/422,853, 12/577,682, 12/629,827, 12/606,136, 12/874,900, 12/422,925, 12/504,131, 12/761,179, and 12/815,339.

Certain embodiments of the present disclosure reduce the size of drivers that are configured to drive a signal, such as a data signal, along a die interconnect to one or more array dies. Further, certain embodiments of the present disclosure reduce the power consumption of the drivers.

In certain embodiments, reducing one or both of driver size and driver power consumption may be accomplished by increasing the number of die interconnects and reducing the number of array dies that are in electrical communication with each die interconnect. For example, instead of one die interconnect in electrical communication with four array dies, there may be two die interconnects, each in electrical communication with a different pair of the four array dies.

In certain embodiments, determining the number of die interconnects and the number of array dies in electrical communication with each die interconnect is based, at least in part, on a load of each array die and a load of the die interconnect that is in electrical communication with one or more of the array dies.

In some embodiments, the load contribution from a die interconnect may be negligible compared to the load contribution from the array dies. In such embodiments, determining the number of die interconnects and the number of array dies in electrical communication with each die interconnect may be based, at least in part, on a load of each array die without considering the load of the die interconnect. However, as the physical size of a memory package shrinks, the load of a die interconnect becomes a non-negligible value relative to the load of the array dies. Thus, as memory packages become physically smaller, it becomes more important to consider the load of the die interconnect in determining the number of die interconnects and the number of array dies in electrical communication with each die interconnect. Advantageously, certain embodiments of the present disclosure account for both the loads of the array dies and the loads of the die interconnects on a conduit (e.g., driver) in determining the number of die interconnects to be used and the number of array dies in electrical communication with each die interconnect.

Figure 1B:
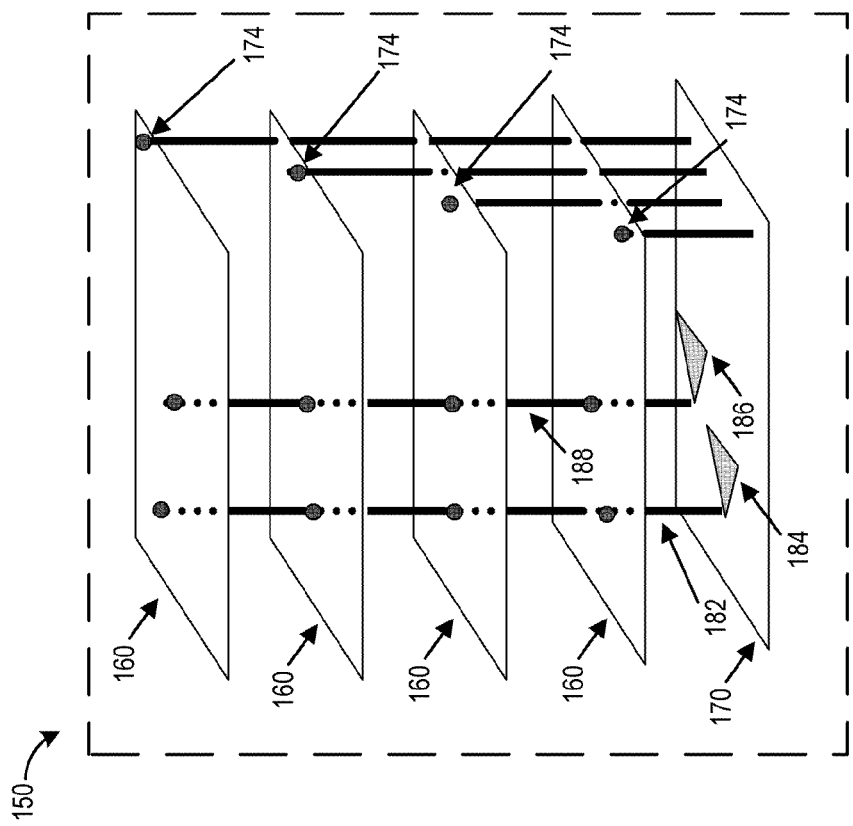
FIGS. 1A and 1B schematically illustrate examples of existing memory package designs.
Figure 1A:
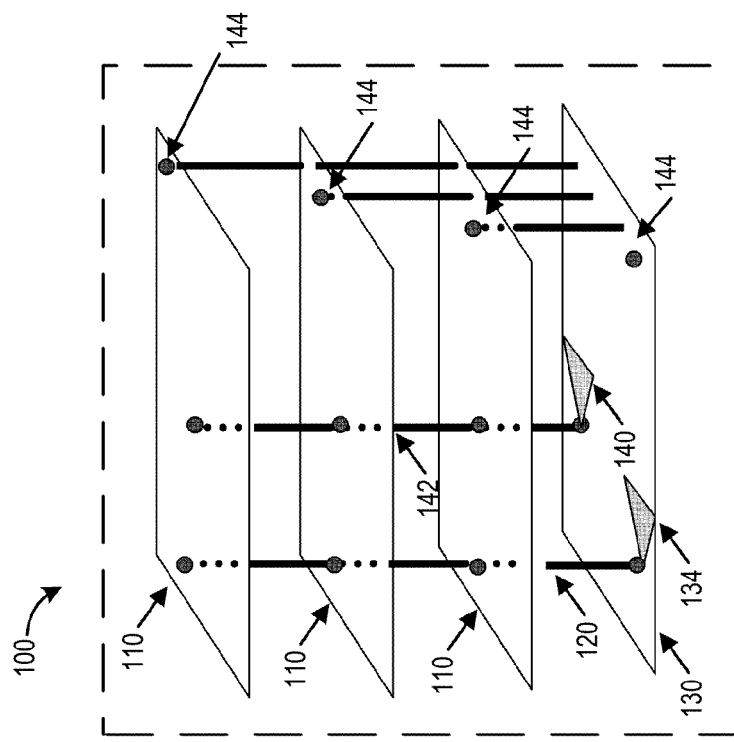
Figure 2:
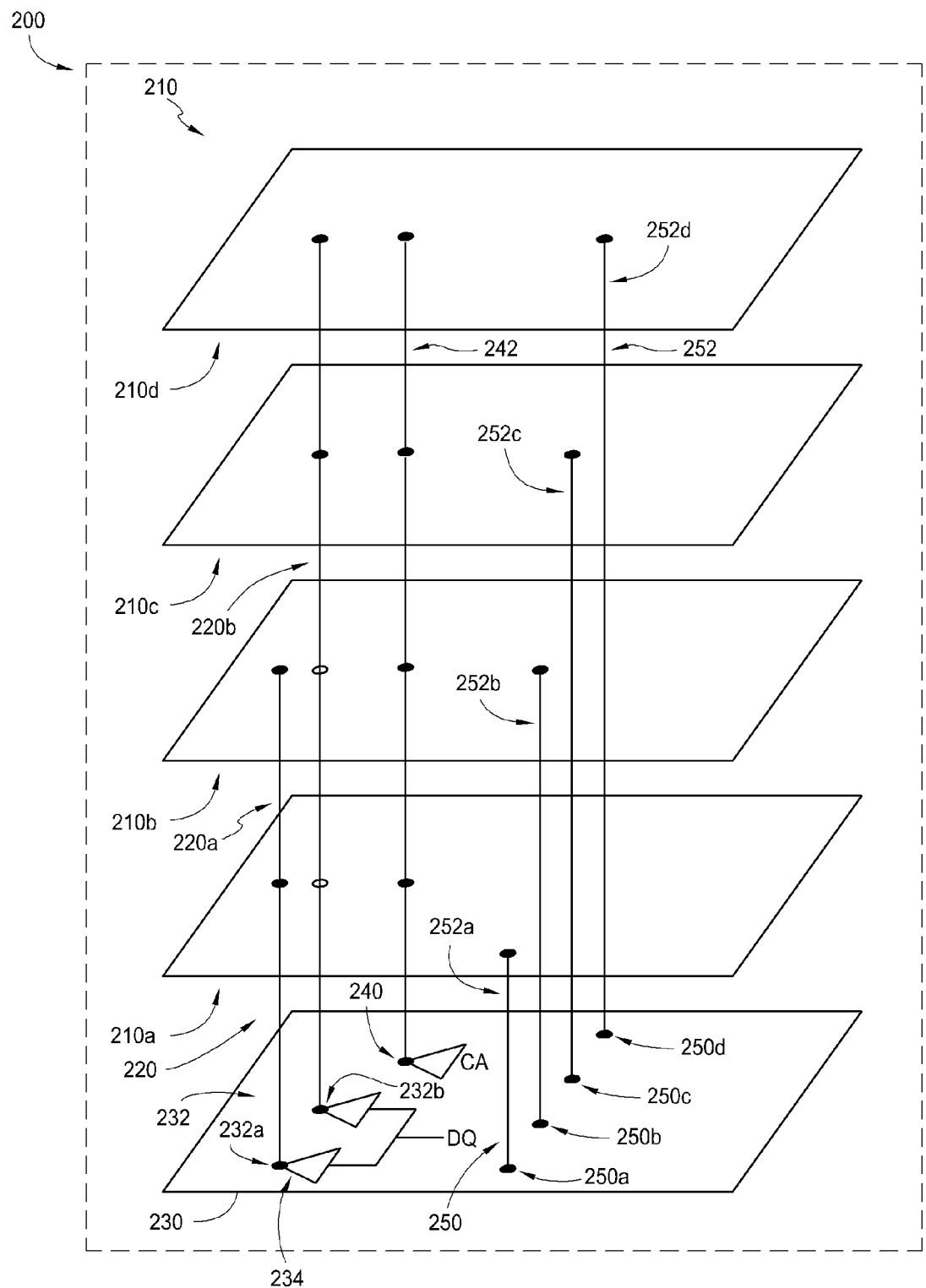
FIG. 2 schematically illustrates an example embodiment of a memory package in accordance with the present disclosure.

FIG. 2 schematically illustrates an example embodiment of a memory package 200 in accordance with the present disclosure. One example of a memory package that includes array dies and a control die is the Hybrid Memory Cube (HMC). Examples of an HMC compatible with certain embodiments described herein are described by the IDF2011 Intel Developer Forum website, http://www.intel.com/idf/index.htm, which includes presentations and papers from the IDF2011 Intel Developer Forum including the keynote address given by Justin Rattner on Sep. 15, 2011. Additional examples of an HMC compatible with certain embodiments described herein are described by the Hybrid Memory Cube Consortium website, http://www.hybridmemorycube.org.

The memory package 200 can include any type of memory package. For example, the memory package 200 may be a DRAM package, a SDRAM package, a flash memory package, or a DDR SDRAM package (e.g., DDR3, DDR4), to name a few. A memory module (not shown) may include one or more memory packages in accordance with the memory package 200. Further, the memory package 200 may include input/output terminals (not shown) that are configured to be placed in electrical communication with circuitry of the memory module to transmit signals between the memory package 200 and a Memory Control Hub (MCH) (not shown).

Figure 3:
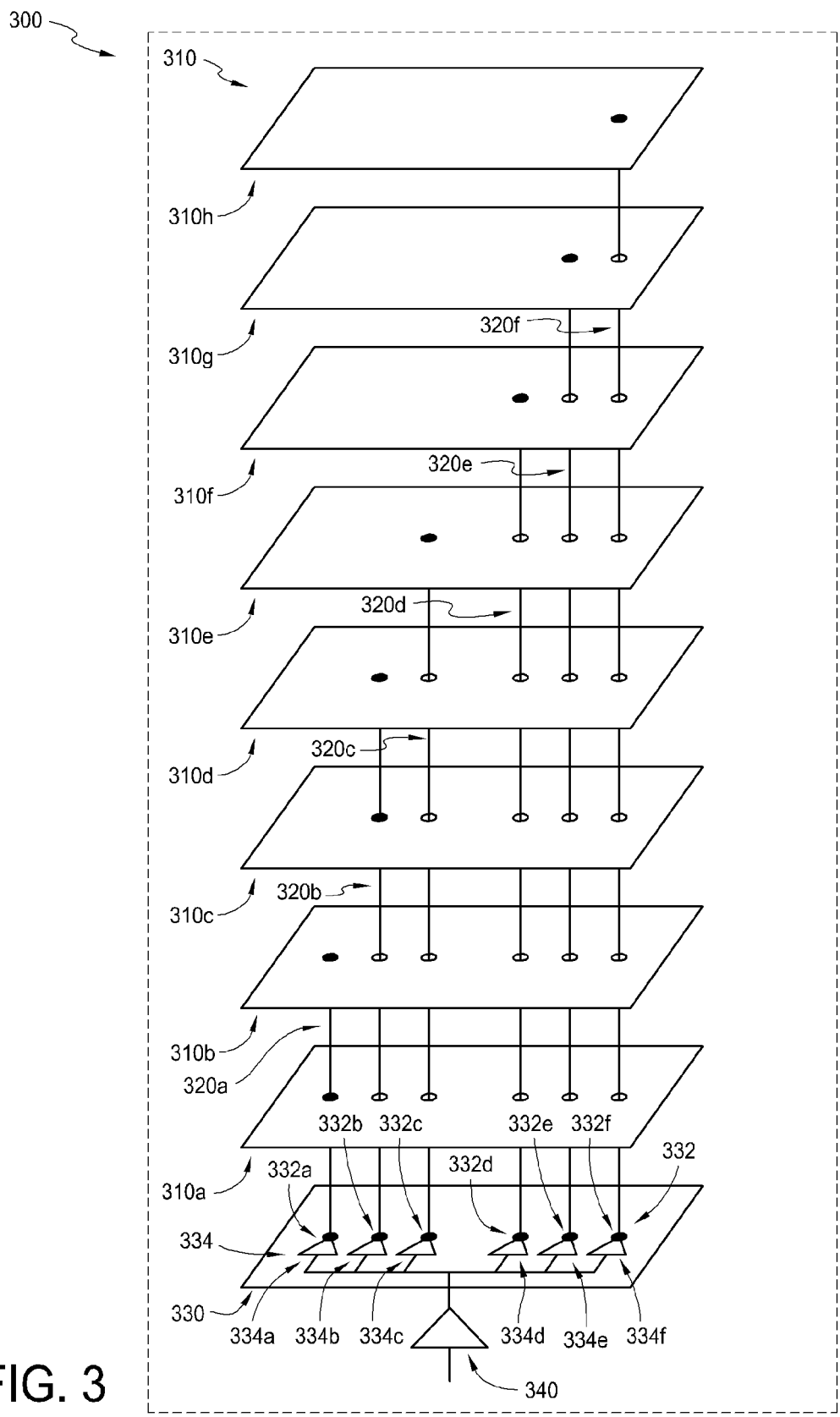
FIG. 3 schematically illustrates another example embodiment of a memory package in accordance with the present disclosure.

The memory package 200 may include a plurality of array dies 210 (e.g., array dies 210a-210d). The plurality of array dies 210 may be sealed within the memory package 200. Further, circuitry of the array dies 210 may be in electrical communication with the input/output terminals of the memory package 200. Although generally referred to as array dies herein, the array dies 210 may also be called slave dies or slave chips. Each of the array dies 210a-210d may include circuitry (e.g., memory cells) (not shown) for storing data. Examples of array dies compatible with certain embodiments described herein are described by the existing literature regarding the Hybrid Memory Cube (e.g., as cited above). As illustrated in FIG. 2, the plurality of array dies 210 may be arranged in a stack configuration known as a three-dimensional structure (3DS). Examples of 3DS compatible with certain embodiments described herein are described by the existing literature regarding the Hybrid Memory Cube (e.g., as cited above). However, the structure or layout of the plurality of array dies 210 is not limited as such, and other structures are possible in accordance with the present disclosure. For example, the plurality of array dies 210 may be arranged in a planar structure, or in a structure that combines 3DS with a planar structure. Moreover, while the memory package 200 is illustrated as including four array dies, the memory package 200 is not limited as such and may include any number of array dies. For example, as illustrated in FIG. 3, the memory package 200 may include eight array dies. As further examples, the memory package 200 may include three or sixteen array dies.

Each of the array dies 210 may include one or more data ports (not shown). The data ports enable electrical communication and data transfer between the corresponding memory circuitry of the array dies 210 and a communication pathway (e.g., a die interconnect).

In the example schematically illustrated in FIG. 2, the memory package 200 includes a plurality of die interconnects 220 (e.g., die interconnects 220a, 220b). For example, certain versions of HMC have been reported to have 512 data ports per die, with the corresponding bits of each die all connected to a single die interconnect (e.g., TSV). Examples of die interconnects include, but are not limited to, through-silicon vias (TSV), conducting rods, wire bonds, and pins. (See e.g., U.S. Pat. Nos. 7,633,165 and 7,683,459.) Each of these die interconnects 220 may be coupled to, or in electrical communication with at least one data port of at least one of the array dies 210. In certain embodiments, at least one of the die interconnects 220 is in electrical communication with at least one data port from each of at least two array dies 210 without being in electrical communication with a data port from at least one array die 210, which may be in electrical communication with a different die interconnect 220.

For example, die interconnect 220a may be in electrical communication with a data port from array die 210a and a data port from array die 210b (as illustrated by the darkened circles in FIG. 2) and not in electrical communication with any data ports from array die 210c or any data ports from array die 210d. The data ports of array dies 210a and 210b in electrical communication with the die interconnect 220a can be corresponding to the same data bit (e.g., D0). Other die interconnects (not shown) can be in electrical communication with other data ports corresponding to other data bits (e.g., D1, D2, . . . ) of array dies 210a and 210b. These other die interconnects can be electrically isolated from the corresponding data ports of array dies 210c and 210d.

However, continuing this example, the die interconnect 220b may be in electrical communication with a data port from array die 210c and a data port from array die 210d (as illustrated by the darkened circles in FIG. 2) (e.g., corresponding to the same data bit, e.g., D0) without being in electrical communication with any data ports from array die 210a and array die 210b. Other die interconnects (not shown) can be in electrical communication with other data ports corresponding to other data bits (e.g., D1, D2, . . . ) of array dies 210c and 210d. Despite not being in electrical communication with any data ports from array die 210a and 210b, in some implementations, the die interconnect 220b may pass through the array dies 210a and 210b (as illustrated by the unfilled circles) e.g., through through-holes or vias of array dies 210a and 210b. For some implementations, each of the array dies 210 may be in electrical communication with corresponding die interconnects 220, without any of the die interconnects 220 being in electrical communication with all of the array dies 210. Where existing systems may utilize a single die interconnect to be in electrical communication with the corresponding data ports of each array die (e.g., the data ports corresponding to the same bit), certain embodiments described herein utilize multiple die interconnects to provide electrical communication to the corresponding data ports of the array dies (e.g., the data ports corresponding to the same data bit) with none of the multiple die interconnects in electrical communication with data ports of all the array dies.

In addition to the plurality of array dies 210, the memory package 200 includes a control die 230, which may also be called a master die. Examples of master dies compatible with certain embodiments described herein are described by the existing literature regarding the Hybrid Memory Cube (e.g., as cited above). In some embodiments, the control die 230 may be one of the array dies 210. Alternatively, the control die 230 may be a modified version of one of the array dies 210. Thus, in some implementations, memory package 200 may include four dies or chips instead of the five illustrated in FIG. 2. Further, in some embodiments, the control die 230 may comprise a logic layer (e.g., the logic layer of an HMC).

The control die 230 may include a number of data conduits 232, which includes data conduits 232a and 232b. Each of these data conduits 232 may be configured to transmit a data signal to a single die interconnect 220. For example, the data conduit 232a may be configured to transmit a data signal to the die interconnect 220a without transmitting the data signal to the die interconnect 220b. Conversely, the data conduit 232b may be configured to transmit the data signal to the die interconnect 220b without transmitting the data signal to the die interconnect 220a (e.g., data conduit 232b is electrically isolated from die interconnect 220a and data conduit 232a is electrically isolated from die interconnect 220b).

In some embodiments, the data conduits 232 may also include one or more drivers 234 as schematically illustrated by FIG. 2. The drivers 234 may be configured to drive the data signals along the corresponding die interconnects 220. In some embodiments, a single data conduit 232 or driver 234 may be in electrical communication with multiple die interconnects 220, each of which may be in electrical communication with different array dies 210.

Each of the data conduits 232 may be configured to receive the data signal from a common source. For instance, the data conduit 232a and the data conduit 232b may each receive a substantially similar, if not identical, data signal from the same signal source (e.g. the data signal corresponding to the same data bit). The source of the data signal may include a data path, a driver, a latch, a pin, or any other construct that may provide a data signal to a data conduit.

The data conduits 232 may each be subject to a load. Although not limited as such, this load may be measured as a capacitive load, such as a parasitic capacitance. The load on each of the data conduits 232 may include at least a load of the die interconnect 220 to which the data conduit 232 is coupled or connected as well as a load of each array die 210 with which the die interconnect 220 is in electrical communication via a data port of the die interconnect 220. Thus, for example, the load of the data conduit 232a may include loads of the die interconnect 220a, the array die 210a, and the array die 210b. Similarly, the load of the data conduit 232b may include loads of the die interconnect 220b, the array die 210c, and the array die 210d.

Generally, a load that would be on a data conduit that was in electrical communication with a die interconnect that was in electrical communication with at least one data port of each of the array dies 210 can be considered the maximum load for a data conduit. This maximum load is the load of a data conduit of a memory package that does not implement the teachings of this disclosure, but is in accordance with conventional configurations.

In some implementations, the difference between the load of the data conduit 232a and the load of the data conduit 232b is less than the maximum load for a data conduit as described above. Thus, in some cases, there may exist a degree of balance or equalization between the loads of the data conduits 232a, 232b. In some implementations, the difference between the load of the data conduit 232a and the load of the data conduit 232b is zero or substantially zero. In some embodiments, the length of each die interconnect 220, and the number of array dies 210 in electrical communication with each die interconnect 220 may be selected to maintain the difference between the load of the data conduit 232a and the load of the data conduit 232b to be at or below a threshold load difference. For example, suppose that the load of each array die 210 is 1, the load of each segment of the die interconnects 220 is 0.25, and that the threshold load difference is 0.5. Using the configuration schematically illustrated in FIG. 2, the load on the data conduit 232a in this example is 2.5 and the load on the data conduit 232b in this example is 3. Thus, in this example, the difference between the load of the data conduit 232a and the load of the data conduit 232b is at the threshold load difference value of 0.5. However, an alternative configuration that places the die interconnect 220a in electrical communication with only the array die 210a, and the die interconnect 220b in electrical communication with the array dies 210b-210d would not satisfy the threshold load difference value of 0.5 of the above example. In the alternative configuration, the load on the data conduit 232a would be 1.25 and the load on the data conduit 232b would be 4. Thus, in the alternative configuration, the difference between the load of the data conduit 232a and the load of the data conduit 232b is 2.75, which is above the threshold load difference value of 0.5.

For certain embodiments, the load of each data conduit is less than the maximum load as described above. Thus, in some cases, the load of the data conduit 232a is less than the maximum load and the load of the data conduit 232b is less than the maximum load. Further, in many implementations, the combined load of the data conduit 232a and the data conduit 232b is less than the maximum load of a single data conduit. In other words, it is possible to design the data conduit 232a and the data conduit 232b to reduce the overall load compared to a single data conduit that is in electrical communication with a die interconnect that is in electrical communication with at least one data port of each of the array dies 210. By reducing the overall load compared to the single data conduit, it is possible in many cases to reduce power consumption. Further, it is possible in many cases to maintain signal quality (e.g. maintain signal amplitude, maintain low signal distortion, etc.) while reducing power consumption. Advantageously, in a number of embodiments, by using multiple data conduits instead of a single data conduit, the speed of the memory package 200 can be increased. In some cases, this speed increase can include a reduced latency in accessing array dies 210 and/or operating the memory package 200 at a higher clock frequency.

Each of the die interconnects 220 may include any type of conducting material. For example, the die interconnects 220 may include copper, gold, or a conductive alloy, such as a copper/silver alloy. Further, the die interconnects 220 may include any type of structure for enabling electrical communication between the data conduits 232 and the data ports of the array dies 210. For example, the die interconnects 220 may include a wire, a conducting rod, or a conducting trace, to name a few. Moreover, the die interconnects 220 may use vias, or through-silicon vias (TSVs) to couple with or to electrically communicate with an array die. For instance, die interconnect 220a may be connected with data ports of the array dies 210a and 210b using vias (illustrated by the filled or darkened circles). Examples of TSVs which may be used with the present disclosure are described further in U.S. Pat. Nos. 7,633,165 and 7,683,459.

In addition, the die interconnects 220 may use via holes to pass through an array die that is not configured to be in electrical communication with the die interconnect. For instance, die interconnect 220b may pass through array dies 210a and 210b using TSVs that do not enable electrical communication between the die interconnect 220b and data ports of the array dies 210a and 210b (illustrated by the unfilled circles). In this way, the array dies 210a, 210b are not responsive to the data signal beings transmitted by the die interconnect 220b. However, the die interconnect 220b may be connected with at least one data port of each of the array dies 210c and 210d using a via (illustrated by the filled or darkened circles). In cases where the die interconnect passes through an array die that is not configured to be in electrical communication with the die interconnect, the TSV may include an insulator or an air gap between the die interconnect and the array die circuitry that is large enough to prevent electrical communication between the die interconnect and the array die circuitry. In certain embodiments, the TSV for array dies that are configured to be in electrical communication with the die interconnect and for array dies that are not configured to be in electrical communication with the die interconnect may be configured the same. However, in such cases, electrical connections leading from the TSV of the array dies that are not configured to be in electrical communication with the die interconnect may not exist or may be stubs. These stubs are not configured to provide electrical communication with the memory cells of the array die.

Although FIG. 2 illustrates a single pair of data conduits 232 corresponding to a single pair of die interconnects 220, this is only to simplify the drawing figure. The memory package 200 may generally include as many additional data conduits and corresponding die interconnects as the number of bits the memory package 200 is designed or configured to support per memory address. Thus, if, for example, the memory package 200 is configured to be a 16-bit memory, the memory package 200 may include 16 pairs of data conduits 232 and 16 pairs of corresponding die interconnects 220. Similarly, if the memory package 200 is configured as a 32- or 64-bit memory, the memory package 200 may include 32 or 64 pairs of data conduits 232 and 32 or 64 pairs of corresponding die interconnects 220. Generally, the data conduits and die interconnects for each bit are configured identically. Thus, for the memory package 200, each data conduit is configured to be in electrical communication with a die interconnect that is configured to be in electrical communication with a pair of the array dies 210. However, it is possible that, in some embodiments, the data conduits and die interconnects of different bits may be configured differently.

In certain embodiments, the same die interconnects and the same corresponding data conduits may be used to transfer data both to and from the array dies 210. In such embodiments, the die interconnects may be bi-directional. In alternative embodiments, separate die interconnects and corresponding data conduits may be used to transfer data to the array dies 210 and data from the array dies 210 to the control die 230. Thus, such embodiments may include double the number of die interconnects and data conduits as embodiments that use the same die interconnect to transfer data to and from an array die.

In some embodiments, the control die 230 may include additional command/address conduits 240 and die interconnects 242, which may be in electrical communication with at least one port of each of the array dies 210. For simplicity, FIG. 2 shows only a single such conduit 240 and die interconnect 242. The command/address conduits 240 are configured to provide corresponding signals to the die interconnects 242. These signals may be command signals, address signals, or may serve as both command and address signals (e.g., may include a memory cell address and a write command or a read command) either simultaneously or based on a determining criterion, such as the edge of a clock signal. The command die 230 may include a command/address conduit 240 and corresponding die interconnect 242 for each bit of the command/address signals that the memory package 200 is configured to support. The number of bits of the command/address signals may be the same or may be different from the number of data bits of the memory package 200.

In addition, in certain embodiments, the control die 230 may include a plurality of chip select conduits 250 (e.g., chip select conduits 250a-250d as shown in FIG. 2). Further, the control die 230 may include corresponding die interconnects 252 (e.g., die interconnects 252a-252d) with one die interconnect 252 in electrical communication with one chip select conduit 250 and one array die 210. Each of the die interconnects 252 may be in electrical communication with a different array die 210. For example, the die interconnect 252a may be in electrical communication with the array die 210a and the die interconnect 252b may be in electrical communication with the array die 210b. Each of the chip select conduits 250 may be configured to provide a chip select signal to a corresponding array die 210 via a corresponding die interconnect 252.

In some embodiments, the control die 230 may include additional drivers that are configured to drive the chip select signals along the die interconnects 252. Alternatively, the chip select signals may be driven by drivers that are external to the control die 230. For example, a register (not shown) that is part of a memory module that includes the memory package 200 may determine the chip select signals and drive the chip select signals to the array dies 210. As a second example, the chip select signals may be provided by an MCH. In some embodiments, the control die 230 may determine the array die 210 to select based on, for example, an address signal. In such embodiments, the control die may generate the chip select signals.

FIG. 3 schematically illustrates another example embodiment of a memory package 300 in accordance with the present disclosure. In certain embodiments, some or all of the embodiments described above with respect to the memory package 200 may be applicable to the memory package 300. However, for ease of illustration and to simplify discussion, certain elements are omitted in FIG. 3, such as the chip select conduits. Nevertheless, it should be understood that the memory package 300 can include the same or similar elements as described above with respect to the memory package 200, including, for example, the chip select conduits.

The memory package 300 may include a plurality of array dies 310 (e.g., array dies 310a-310h). In the implementation illustrated in FIG. 3, the memory package includes eight array dies. However, as stated earlier, the memory package 300 may include more or fewer array dies. Each of the array dies 310 may include one or more ports (not shown) that enable electrical communication between the circuitry of the array dies 310 and one or more die interconnects 320. Each of these die interconnects 320 may be coupled to, or in electrical communication with at least one port of at least one of the array dies 310. As with the memory package 200, in certain embodiments, at least one of the die interconnects 320 is in electrical communication with at least one port from each of at least two array dies 310 without being in electrical communication with a port from at least one array die 310, which may be in electrical communication with a different die interconnect 320.

In addition to the plurality of array dies 310, the memory package 300 includes a control die 330. In some embodiments, the control die 330 may include a number of conduits 332 (e.g., conduits 332a-332f). Each of these conduits 332 may be configured to transmit a signal to a single die interconnect 320.

Further, implementations of the conduits 332 may include one or more drivers 334 (e.g., drivers 334a-334f). Each of the drivers 334 may be configured to drive a signal along a corresponding die interconnect 320. For instance, the driver 334a of the conduit 332a may be configured to drive a signal along the die interconnect 320a to one or more of the array dies 310a and 310b. As a second example, the driver 334b of the conduit 332b may be configured to drive a signal along the die interconnect 320b to one or more of the array dies 310c and 310d. Although the die interconnect 320b may pass through the array dies 310a and 310b, because the die interconnect 320b, in the example illustrated in FIG. 3, is not configured to be in electrical communication with the array dies 310a and 310b, the driver 334b does not drive the signal to the array dies 310a and 310b.

In some embodiments, the signal can be a data signal, a command or address signal, a chip select signal, a supply voltage signal, or a ground voltage signal, to name a few. Further, as the signal is not limited to a data signal, in some embodiments, the conduits 332 may include conduits configured to provide signals other than data signals to the die interconnects 320. For example, the conduits may include conduits configured to provide a command or address signal, a chip select signal, a supply voltage signal, or a ground voltage signal to one or more die interconnects. Consequently, in some embodiments, the drivers 334 may be configured to drive signals other than data signals.

Generally, the signal that each of the drivers 334 drive to the corresponding die interconnects 320 is from a common source. Thus, each of the drivers 334, in certain embodiments, is driving the same signal to each corresponding die interconnect 320.

The size of the drivers 334 is generally related to the load on the driver 334. In certain embodiments, the load on each driver 334 corresponds to the load of the respective conduit 332. Although not limited as such, the load may be measured as a capacitive load, such as a parasitic capacitance.

The load on each of the conduits 332 may include at least the loads of the die interconnect 320 with which the conduit 332 is coupled or connected as well as the loads of each array die 310 with which the die interconnect 320 is in electrical communication via a port of the die interconnect 320. Thus, for example, the loads of the conduit 332*a* may include the loads of the die interconnect 320*a*, the array die 310*a*, and the array die 310*b*. Similarly, the loads of the conduit 332*b* may include the loads of the die interconnect 320*b*, the array die 310*c*, and the array die 310*d*. The loads of both conduits 332*a* and 332*b* include a load of two array dies 310 because the corresponding die interconnects 320 are each configured to be in electrical communication with two array dies 310. On the other hand, the load of the conduit 332*c*, which may include the loads of the die interconnect 320*c* and the array die 310*e*, includes a load of one array die 310*e* because the corresponding die interconnect 320*c* is configured to be in electrical communication with only one array die 310.

As previously described with respect to FIG. 2, a load that would be on a conduit that was in electrical communication with a die interconnect that was in electrical communication with at least one port of each of the array dies 310 can be considered the maximum load for a conduit. This maximum load is the load of a conduit of a memory package that does not implement the teachings of this disclosure, but is used in accordance with conventional configurations.

In some implementations, the difference between the loads of any pair of the conduits 332 is less than the maximum load for a conduit as described above. For instance, the difference between the load of the conduit 332*a* and the load of the conduit 332*b* is less than the maximum load. As a second example, the difference between the load of the conduit 334*f* and any one of the conduits 334*a*-334*e* is less than the maximum load. Thus, in some cases, the load on each of the conduits 332 may be, at least partially balanced or equalized to reduce or minimize the difference between the load of any pair of the conduits 332. In some implementations, the difference between the load of a pair of the conduits 332 is zero or substantially zero. In some embodiments, the length of each die interconnect 320, and the number of array dies 310 in electrical communication with each die interconnect 320 may be selected to maintain the difference between the load of any pair of the conduits 332 to be at or below a threshold load difference.

For certain embodiments, the load of each conduit is less than the maximum load as described above. Thus, for example, the load of the conduit 332*a*, the load of the conduit 332*b*, and the load of the conduit 332*c* are each less than the maximum load defined above.

In certain embodiments, the load associated with each of the array dies 310 may be substantially equivalent. For example, the load of the array die 310*a* may be substantially equal to the load of the array die 310*h*. Thus, the load contribution from the array dies 310 for a specific conduit 332 may be measured as a multiple of the array dies that are in electrical communication with a die interconnect 320 corresponding to a specific conduit 332. For example, assuming that the load of each of the array dies 310 is then the contribution of the load from the array dies 310 to the conduit 332*a* would be 2L because the die interconnect 320*a* corresponding to the conduit 332*a* is in electrical communication with two array dies 310, array dies 310*a* and 310*b*. In alternative embodiments, the load of each of the array dies 310*a* may differ. For example, the load of array die 310*a* may be L and the load of the array die 310*b* may be 1.25L.

Similar to the array dies 310, in some embodiments, a die interconnect 320 can be considered to comprise a plurality of segments, with each segment of a die interconnect 320 contributing a substantially equivalent load to the load of the die interconnect 320. In this case, the segment of the die interconnect 320 may refer to the portion of the die interconnect between two successive or adjacent dies (array die-to-array die, master die-to-array die, or both) along the die interconnect 320. Further, the segment may be defined as a portion of the die interconnect 320 between the dies exclusive of a portion of the dies. For example, one segment of the die interconnect 320*a* may extend from the top of the array die 310*a* to the bottom of the array die 310*b*. Alternatively, the segment may be defined to include at least a portion of at least one of the array dies 310. For example, one segment of the die interconnect 320*a* may extend from the center of array die 310*a* to the center of array die 310*b*. As a second example, one segment of the die interconnect 320*a* may extend from the top of the control die 330 to the top of the array die 310*a*, and therefore may include a portion of the die interconnect 320*a* extending from the bottom of the array die 310*a* to the top of the array die 310*a*. In some implementations, the segments are substantially equal in length to each other. Moreover, the load contribution of each segment may be substantially equal to each other. Alternatively, the segments may be unequal in length and/or may each contribute a different load to the total load of a die interconnect 320. Further, in some cases, the load contribution of a segment of the die interconnect 320 that is in electrical communication with a port of an array die 310 may differ from the load contribution of a segment of the die interconnect 320 that is not in electrical communication with a port of an array die 310.

In some cases, the load contribution of each segment of the die interconnect 320 may be measured as a fraction of the load contribution from an array die 310. For example, the load of one segment of the die interconnect 320*a* may be equivalent to one quarter of the load of an array die 310. Thus, for example, the load of the conduit 332*a* may be 2.5L assuming a load contribution of L per array die 310 (two in this case) in electrical communication with the die interconnect 320*a* and a load contribution of 0.25L per segment (two in this case) of the die interconnect 320*a*. As a second example, the load of the conduit 332*f* may be 3L assuming the same load values as the previous example and a load contribution from one array die 310*h* and eight die interconnect 320*f* segments. Table 1 specifies the capacitive load values for each conduit 332 assuming, as with the previous two examples, that the load of each of the array dies 310 is L, and that the load of each segment of the die interconnects 320 is 0.25L. Table 1 also specifies the deviation in load from the conduits having the highest load value, which in this example are conduits 332b and 332f.

TABLE 1

| Conduit | Number of Array Dies | Number of Die Interconnect Segments | Capacitive Load | Deviation from Maximum Load |
|---------|---------------------|-------------------------------------|-----------------|-----------------------------|
| 332a    | 2                   | 2                                   | 2.5 L           | 0.5                         |
| 332b    | 2                   | 4                                   | 3 L             | 0                           |
| 332c    | 1                   | 5                                   | 2.25 L          | 0.75                        |
| 332d    | 1                   | 6                                   | 2.5 L           | 0.5                         |
| 332e    | 1                   | 7                                   | 2.75 L          | 0.25                        |
| 332f    | 1                   | 8                                   | 3 L             | 0                           |

As can be seen from Table 1, the maximum load of any conduit 332, using the example values previously described, is 3L, or rather three times the load of a single array die 310. Assuming the same example values, the load of a conduit in electrical communication with a die interconnect that itself is in electrical communication with each array die 310 would be 10L. Thus, certain embodiments of the present disclosure enable a reduction in the load of the conduits 332. Consequently, in some embodiments, the drivers 334 may each be smaller than a single driver that is configured to drive a signal from a conduit along a single die interconnect that is in electrical communication with a port from each of the array dies 310. Moreover, the drivers 334 may include smaller transistor sizes than a single driver that is configured to drive a signal to each of the array dies 110.

As can be seen from Table 1, conduits 332b and 332f have the largest capacitive load of the group of conduits, which is 3L. Conduit 332 has the smallest capacitive load of the group of conduits, which is 2.25L and which is a deviation of only 0.75 from the maximum load. Thus, in some embodiments, each of the drivers 334 may be substantially similar in size. In certain implementations, the drivers 334 may vary in size based on the total capacitive load on each conduit 332. Thus, the driver 334f may be larger than the driver 334e. Alternatively, each driver 334 may be substantially equal and may be configured based on the drivers 334 with the largest load, which are drivers 334b and 334f in the example illustrated in FIG. 3 and Table 1.

In some embodiments, the capacitive load of each conduit 332 or driver 334 can be calculated using formula (1).

$$CL = AD + \frac{S}{M} \quad (1)$$

In formula (1), CL represents the capacitive load of a conduit 332 or driver 334, AD represents the number of array dies 310 in electrical communication with a die interconnect 320 that is in electrical communication with the conduit 332 and/or driver 334, S represents the number of die interconnect segments of the die interconnect 320, and M represents the ratio of the load of an array die 310 to the load of a segment of a die interconnect 320. Thus, using formula (1) and the example values described above, the load of the driver 332a, for example, can be calculated with the following values: AD=2, for two array dies 310; S=2, for the two segments of the die interconnect 320a; and M=4, for the ratio of the load of an array die 310, L, to the load of a segment of the die interconnect 320a, 0.25L. Therefore, as can be seen from Table 1, the capacitive load of the driver 332a is 2.5L where L is the load of a single array die.

In some cases, the load on each conduit 332 and/or driver 334 may be evenly balanced. In other words, the load on each conduit 332 and/or driver 334 may be substantially the same. To achieve a balanced load, each of the conduits 332 may be in electrical communication with a combination of array dies 310 and die interconnect 320 segments that results in a load that is substantially equivalent to the loads of the other conduits 332. In certain embodiments, the load of the conduits 332 is balanced despite each conduit 332 being in electrical communication with a different subset of the array dies 310. However, in alternative embodiments, the load of each conduit 332 and/or driver 334 may differ. This difference in the load of the conduits 332 and/or drivers 334 may be a design decision (e.g. to maintain a specific number of drivers). Alternatively, or in addition, the load difference between conduits 332 and/or drivers 334 may occur because the loads of the array dies 310 and the die interconnect segments 320 do not allow for perfect or substantially even load balancing.

As previously stated, in some embodiments the loads of the conduits 332 and/or drivers 334 may be balanced to minimize the difference between any pair of conduits 332 and/or drivers 334. For example, as illustrated in FIG. 3, a driver in electrical communication with a longer die interconnect, which may consequently include more die interconnect segments, is likely to obtain a larger load contribution from the die interconnect than a driver in electrical communication with a shorter die interconnect (e.g., compare driver 334f to 334a). Thus, the driver in electrical communication with the longer die interconnect may be in electrical communication with fewer array dies than the driver in electrical communication with the shorter die interconnect (e.g. compare driver 334f to 334a). The selection of die interconnect length and the selection of array dies to place in electrical communication with the die interconnects may therefore be dependent on the load of each segment of the die interconnects 320 and the loads of the array dies 310.

Alternatively, or in addition, the loads of the conduits 332 and/or drivers 334 may be balanced to reduce the maximum load of each conduit 332 and/or driver 334. Further, in some embodiments, the maximum load of each conduit 332 and/or driver 334 may be reduced to maintain the load of each conduit 332 and/or driver 334 to be at or below a threshold load difference.

Although not illustrated in FIG. 3, each of the conduits 332 may include one or more additional drivers configured to drive a signal received from an array die via a corresponding die interconnect 320. The additional drivers may drive the signal to a processor, a register, a latch, or any other component or device that may or may not be part of a memory module that includes the memory package 300. In some implementations, one or more of the die interconnects 320 are configured to be bi-directional, thereby enabling a signal to be driven to the array dies 310 via the die interconnect 320, and to enable a signal received from the array dies 310 along the same die interconnect 320 to be transmitted to a corresponding conduit 332 of the control die 330. Alternatively, the memory package 300 comprises one or more die interconnects 320 that are configured to enable a signal to be driven to the array dies 310 without enabling a signal to be received from the array dies 310 (e.g., the die interconnects 320 may not be bi-directional). In certain embodiments where one or more of the die interconnects 320 are not bi-directional, the memory package 300 may include additional die interconnects (not shown) that are in electrical communication with the one or more additional conduits or drivers and that are configured to enable a signal from the array dies 310 to be transmitted to the one or more additional conduits or drivers.

In addition to the drivers 334 of the control die 330, the memory package 300 may include one or more pre-drivers 340. A pre-driver 340, shown schematically in FIG. 3, may be large enough to drive a signal (e.g., a data signal) to any of the drivers 332 and subsequently, to any of the array dies 310. Thus, using the same example values as described above in relation to Table 1, a load of the pre-driver 340 may be at least 10L, which is the load of a conduit in electrical communication with a die interconnect that is in electrical communication with a port from each of the array dies 310. In some embodiments, the memory package 300 may include any number of additional drivers and/or latches for buffering and/or driving the signal to any of the array dies 310.

Just as the memory package 300 may include a pre-driver 340 for providing a signal to the conduits 332, the memory package 300 may include a post-driver (not shown) for driving an output signal from the control die 330. This post-driver may drive the output signal to additional latches and/or drivers. In some embodiments, the post-driver may drive the signal from the memory package 300 to a bus or other electrical path that is in electrical communication with the memory package 300.

Figure 4:
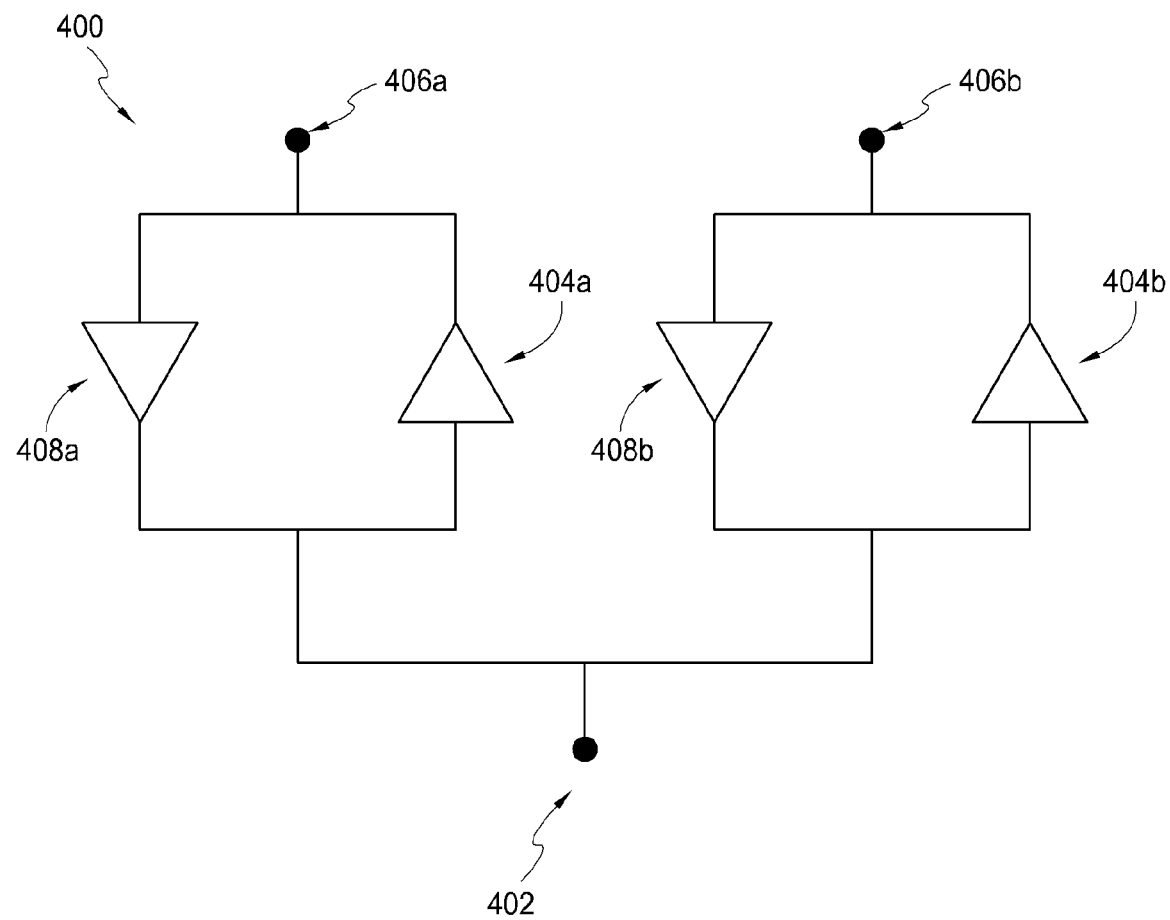
FIG. 4 schematically illustrates an example embodiment of a driver structure of a control die in accordance with the present disclosure.

FIG. 4 illustrates an example embodiment of a driver structure 400 of a control die (e.g. control die 230) in accordance with the present disclosure. The driver structure 400 is configured for a single data bit. Thus, a control die for a 32-bit memory package will generally include at least 32 instances of the driver structure 400, one per bit. In some embodiments, the control die 230 may include the driver structure 400 in place of the combination of drivers 232a and 232b. Similarly, in certain embodiments, the control die 330 may include a structure similar to the driver structure 400 in place of the drivers 334. In such embodiments, the driver structure 400 would be modified to enable a signal (e.g., data signal) to be driven to the six conduits 332.

The driver structure 400 can include an input/output port 402 configured to receive or send a signal, such as a data signal. Signals received at the input/output port 402 can be provided to the drivers 404a and 404b. In turn, these drivers 404a and 404b can drive the signal to conduits 406a and 406b respectively, which are in electrical communication with corresponding die interconnects. Each of the die interconnects may be in electrical communication with different array dies in accordance with certain embodiments described herein.

In some embodiments, the driver structure 400 is bi-directional. In such embodiments, operation of the drivers 404a and 404b, and 408a and 408b may be controlled or enabled by a control signal (e.g., a directional control signal). This control signal, in some cases, may correspond to one or more of a command/address signal (e.g., read/write) and a chip select signal. In some implementations, the drivers 404a and 404b may drive a signal to the array die corresponding to the chip select signal, and not to array dies that do not correspond to a chip select signal. For example, suppose the conduit 406a is in electrical communication with array dies one and two (not shown), and that the conduit 406b is in electrical communication with array dies three and four (not shown). If a chip select signal is received corresponding to array die two, then in some implementations, driver 404a may be configured to drive a signal along a die interconnect in electrical communication with the conduit 406a to array die one and two. In this example, the driver 404b would not drive the signal because the chip select signal does not correspond to either array die three or array die four.

In some embodiments, the drivers 404a and 404b may drive a signal to all of the array dies. For example, assume the memory package that includes the driver structure 400 also includes four array dies. If the die interconnect in electrical communication with the conduit 406a is in electrical communication with two of the array dies, and if the die interconnect in electrical communication with the conduit 406b is in electrical communication with the other two array dies, then the drivers 404a and 404b may drive a signal to all four of the array dies of this example.

Similar to the input/output port 402, the conduits 406a and 406b can be configured to receive a signal from the die interconnects that are in electrical communication with the conduits 406a and 406b. In turn, the signal received at one of the conduits 406a and 406b can be provided to drivers 408a and 408b respectively. The drivers 408a and 408b can each be configured to drive a signal received from a respective data conduit 406a and 406b to the input/output port 402 and to another component that may be in electrical communication with the input/output port 402, such as a MCH.

In some embodiments, one or more chip selects, as illustrated in FIG. 2, may be used to select, determine, or enable the array die that communicates the signal to or from one or more of the conduits 406a and 406b and the drivers 408a and 408b. Similarly, in some embodiments, the chip select may select, determine, or enable the array die to receive and/or respond to the signal driven by the drivers 404a and 404b to the array dies.

It should be noted that the driver structure 400 is a non-limiting example for arranging drivers in a control die. Other driver structures are possible. For example, instead of the drivers 404a and 408a being in electrical communication with the same conduit 406a, each of the drivers 404a and 408a can be in electrical communication with a separate conduit and consequently a separate die interconnect. In such an example, the drivers 404a and 408a may still be in electrical communication with the same input/output port 402, or each driver may be in electrical communication with a separate port, the driver 404a in electrical communication with an input port, and the driver 408a in communication with an output port.

Figure 5:
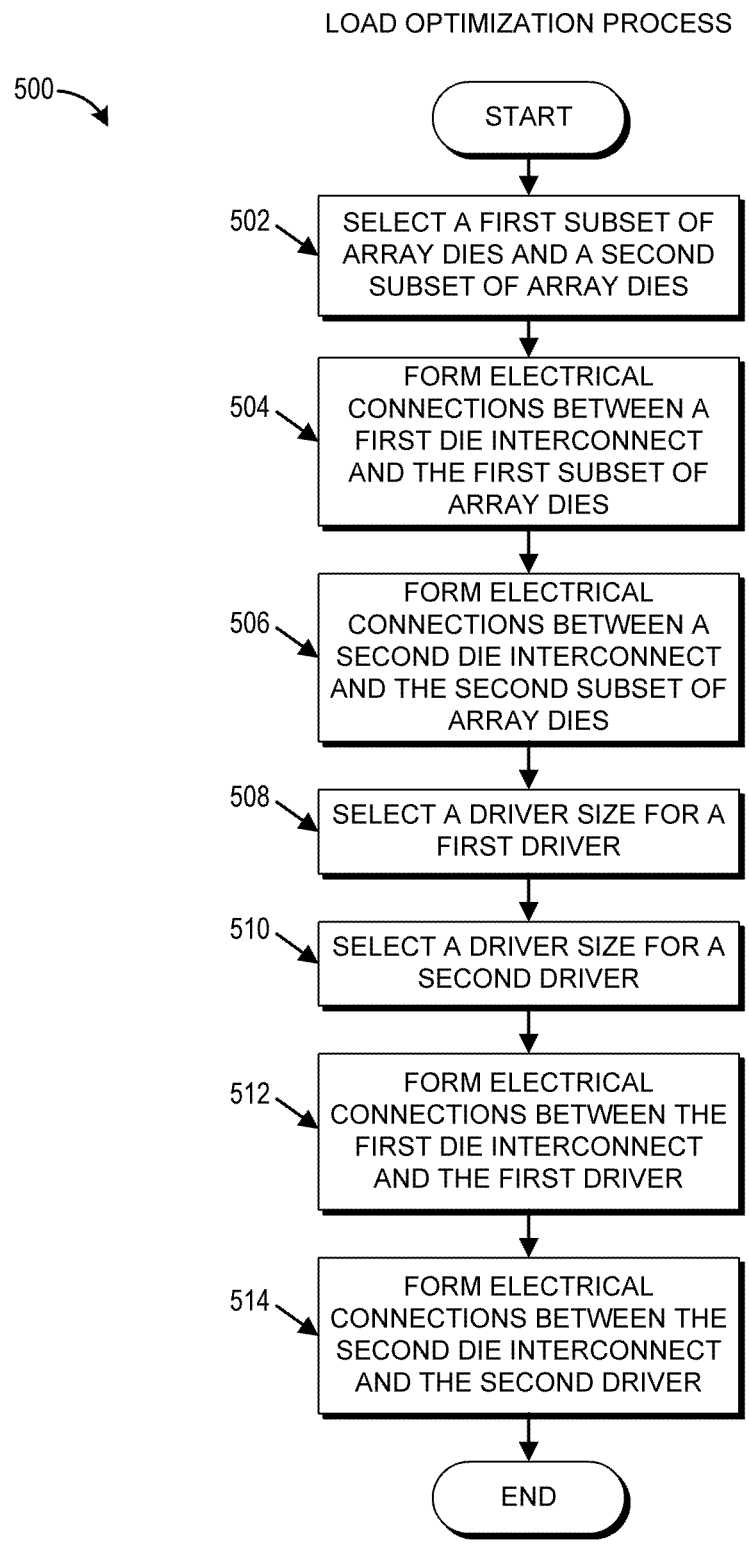
FIG. 5 presents a flowchart for an example embodiment of a load optimization process.

FIG. 5 presents a flowchart for an example embodiment of a load optimization process 500. In certain embodiments, the load optimization process 500 may be performed, at least in part, by one or more computing systems. Further, the process 500, in some embodiments, may be used to optimize one or more loads in a memory package (e.g. memory package 200 or memory package 300). Optimizing the loads in the memory package can include optimizing the load on one or more conduits and/or drivers. As previously described with respect to FIGS. 2 and 3, the memory package can include a plurality of array dies, a plurality of die interconnects, and a control die. Furthermore, the control die can include a plurality of drivers, each of which may be configured to drive a signal along a die interconnect.

In some implementations, the process 500 can comprise selecting a first subset of array dies and a second subset of array dies from a plurality of array dies (e.g., array dies 310), as shown in operational block 502. Generally, the first subset of array dies and the second subset of array dies may be exclusive of one another. Thus, the first subset of array dies does not include any array dies from the second subset of array dies and vice versa. However, in some cases there may be some overlap between the first subset of array dies and the second subset of array dies. Further, in some cases, at least one of the subsets of array dies includes more than one array die. For instance, the first subset of array dies may include two array dies, and the second subset of array dies may include one array die, which, depending on the embodiment, may or may not be included in the first subset of array dies.

Further, the first subset of array dies and the second subset of array dies may be selected to balance a load on a first driver and a load on a second driver based, at least in part, on the loads of the array dies 310 and on the loads of the die interconnect segments from a first and a second die interconnect. The first die interconnect may be in electrical communication with the first driver and the second die interconnect may be in electrical communication with the second driver. In some embodiments, the first subset of array dies and the second subset of array dies are selected to balance a load on a first conduit and a load on a second conduit. The load on each driver and/or conduit may be calculated using formula (1) as previously described above. In some embodiments, the first subset of array dies and the second subset of array dies may be selected to balance a load on a first driver and a load on a second driver based, at least in part, on the loads of the array dies 310 without considering the loads of the die interconnect segments from the first die interconnect and the second die interconnect.

The process 500 further comprises forming electrical connections between the first die interconnect and the first subset of array dies in an operational block 504. The process 500 further comprises forming electrical connections between the second die interconnect and the second subset of array dies in an operational block 506. Forming the electrical connections places the die interconnects in electrical communication with the respective subsets of array dies. In some embodiments, forming the electrical connections can comprise forming electrical connections between the die interconnects and at least one port from each array die of the respective subsets of array dies.

The process 500 further comprises selecting a driver size for a first driver at block 508 and selecting a driver size for a second driver at block 510. Selecting the driver size can be based, at least in part, on the calculated load on the driver. Generally, the greater the load on the driver, the larger the driver is selected to drive a signal along, for example, a die interconnect. The size of the driver may be adjusted by the selection of the transistor size and/or number of transistors included in the driver. A larger driver often consumes more power than a smaller driver. Thus, in certain embodiments, balancing the loads on the drivers to reduce the load on each driver can reduce the power consumption of a memory package.

In some embodiments, the size of the first driver and the size of the second driver are both less than the size sufficient for a driver to drive a signal along a die interconnect to each of the array dies 310 (e.g., with less than a predetermined or threshold signal degradation). The threshold signal degradation can be based on any one or more characteristics of a signal. For example, the threshold signal degradation can be based on the amplitude of the signal, the frequency of the signal, the noise distortion included in or introduced into the signal, or the shape of the signal, to name a few.

The process 500 further comprises forming electrical connections between the first die interconnect and the first driver in an operational block 512. Similarly, the process 500 further comprises forming electrical connections between the second die interconnect and the second driver in an operational block 514. Forming the electrical connections places the die interconnects in electrical communication with the respective drivers. In some embodiments, forming the electrical connections can comprise forming electrical connections between the die interconnects and a data conduit that includes the respective driver.

Advantageously, certain embodiments of the present disclosure reduce the load on each conduit and on each corresponding driver. In certain embodiments, reducing the load on a driver may increase the speed of data transfer between the array dies and other components in a computer system (e.g. a MCH or a processor). Further, reducing the load on a driver may result in reduced power consumption by the driver and consequently, by the memory package. In addition, certain embodiments of the present disclosure may minimize current switching noise.

Operational Modes

Figure 6A:
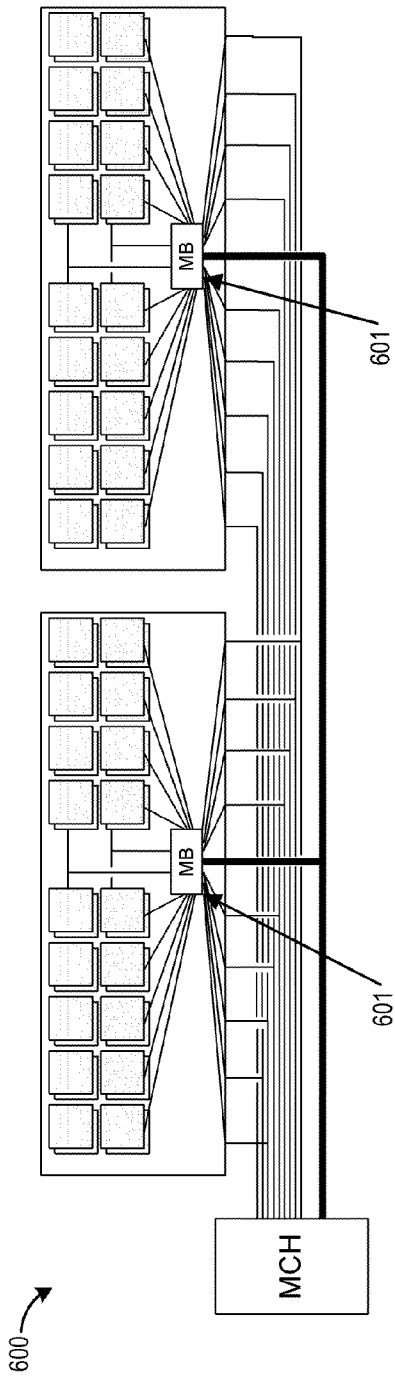
FIGS. 6A and 6B schematically illustrate an example of a Load Reduction Dual In-line Memory Module (LRDIMM) and a HyperCloud™ Dual In-line Memory Module (HCDIMM) architecture respectively.

A proposed three-dimensional stacking (3DS) standard for dual in-line memory modules (DIMMs) being considered by the Joint Electron Devices Engineering Council (JEDEC) addresses three major shortcomings in the current JEDEC registered DIMM (RDIMM) and JEDEC load reduced DIMM (LRDIMM) standards (an example LRDIMM structure 600 is schematically illustrated in FIG. 6A). These shortcomings include:

a) The DIMM density limitation due to the fixed number of chip-select signals received by the DIMM from the system memory controller.
b) The performance loss due to the increased load on the data bus as the DIMM density (e.g., the number of DRAM devices and number of ranks) increases.
c) The upper bound of the DIMM density due to the physical DIMM form factor.

Figure 6B:
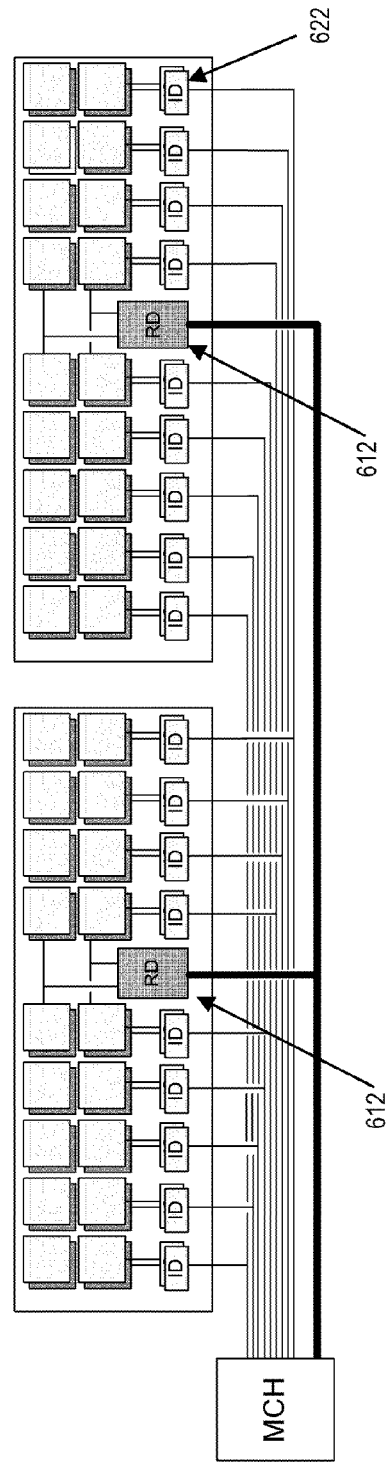

Further, the LRDIMM structure 600 may have timing issues due to signals passing through a single memory buffer 601. In addition, the increased size of the data path of the LRDIMM architecture 600, compared to the HCDIMM architecture 602, an example of which is schematically illustrated in FIG. 6B, may result in more latency and signal integrity issues.

Figure 7:
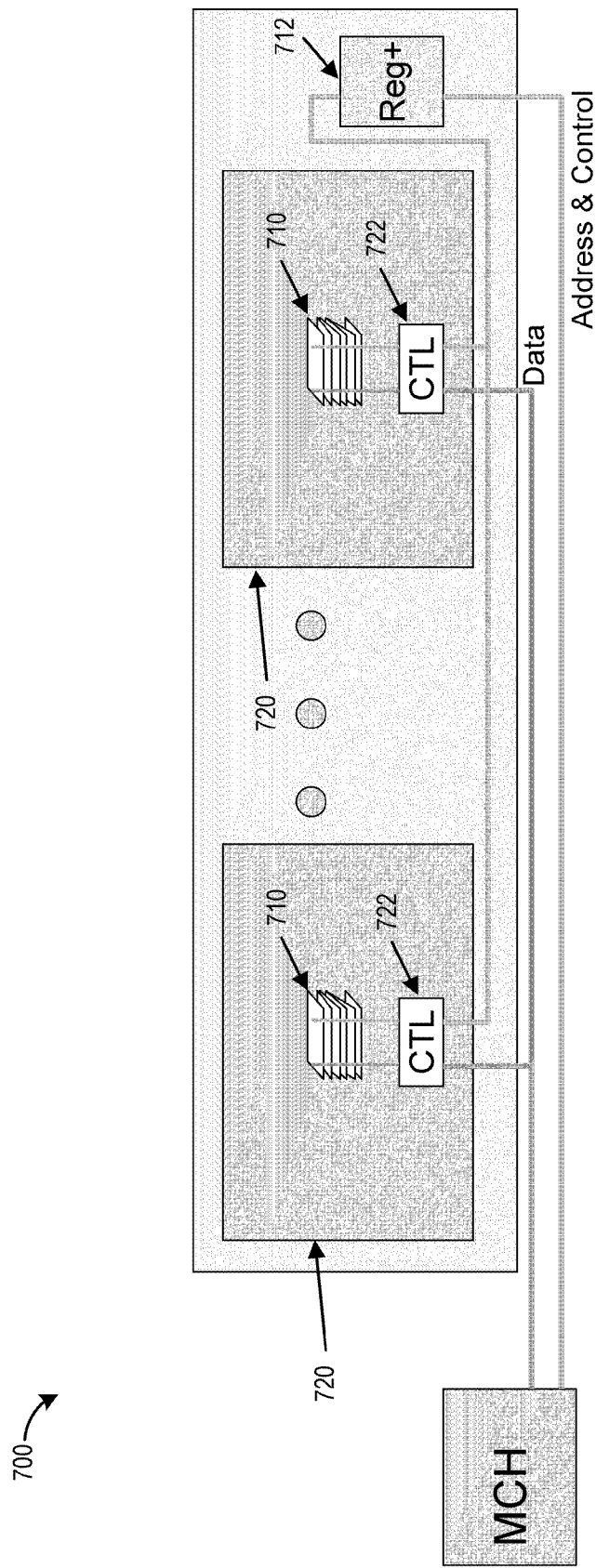
FIG. 7 schematically illustrates an example of a Three-Dimensional Structure Dual In-line Memory Module (3DS-DIMM) architecture.

FIG. 7 schematically illustrates an example memory module 700 that has previously been proposed for the 3DS-DIMM standard. The proposed 3DS Dual In-line Memory Module (3DS-DIMM) schematically illustrated in FIG. 7 attempts to address the above shortcomings using two components, a 3DS register 712 and a controller die 722. In some implementations, the 3DS-DIMM 700 includes the 3DS register 712 (also known as an enhanced DDR3 register). The 3DS register 712 may include a DDR3 JEDEC standard register with a "rank multiplication" circuit, which increases the number of the output chip-select signals for selecting an array die 710 by decoding one or more higher-order row or column address bits with the incoming chip-select signals from the system controller. The 3DS Register 712 can also include a command/address buffer, a register operational code buffer (RC word buffer), and rank multiplication logic (e.g., supporting rank multiplication of 1-to-2, 1-to-4, and/or 1-to-8). The 3DS register addresses shortcoming (a) of the JEDEC RDIMM and LRDIMM listed above.

Another component of the proposed 3DS-DIMM is a 3DS dynamic random-access memory (DRAM) package 720. The 3DS DRAM package 720 includes a plurality of stacked DDR DRAM chips 724 or array dies. The 3DS DRAM package 720 has a data I/O load that is equivalent to the data I/O load of a single-die DRAM package, regardless of the actual number of DRAM dies in the 3DS DRAM package 720. The 3DS DRAM package 720 may comprise a plurality of array dies (e.g., 2, 4 or 8 DDR DRAM dies) and a controller die 722. The controller die 722 may include data buffers, a data path timing controller, a secondary command/address buffer, a programmable secondary 1-to-2 rank decoder, and a data path signal (e.g., ODT, ODT, RTT) controller. Examples of such memory packages include HMC. The 3DS DRAM package 720 addresses the shortcomings (b) and (c) of the JEDEC RDIMM and LRDIMM listed above. However, there are deficiencies in the proposed 3DS-DIMM standard as described below.

The JEDEC DDR3 RDIMM standard contains two major components: a DDR3 register and a plurality of DRAM packages each comprising one or more DRAM chips or dies. The DDR3 register serves as a command/address signal buffer and as a command/control decoder. This DDR3 register holds a set of register control (RC) words, which a computer system configures to ensure the proper operation of the RDIMM. The DDR3 register contains a phase-lock-loop (PLL), which functions as a clock synchronizer for each RDIMM. The DDR3 register outputs a set of buffered command/address signals to all the DRAM packages on the RDIMM, but the data signals are directly fed to the DRAM packages from the system memory controller.

In contrast to the JEDEC DDR3 RDIMM standard, the 3DS-DIMM proposal requires the DRAM package 720 to include the controller die 722 that controls all data paths timing and operations. This arrangement of the DRAM package reduces the load on the data bus, however, it presents three significant shortcomings:
1) The command/address buffer in the 3DS DRAM package introduces clock cycle latency since it needs to provide clock synchronous operation to the DRAM dies in the package.
2) The data path control circuit (e.g., ODT, read/write data direction) in the control die becomes very complicated to support semi-synchronous (fly-by) data path control among all 3DS DRAM packages that are on a DIMM.
3) The variations in the DRAM die timing characteristics within each 3DS DRAM package would be likely to require resynchronization of the data signals during the read/write operations, which increases the read/write latency and the read-to-write and write-to-read turn around time.

The 3DS-DIMM proposal can also be compared to the HyperCloud™ (HC) DIMM architecture of Netlist, Inc. An example of the HCDIMM architecture 602 is illustrated in FIG. 6B. Further details and embodiments of the HCDIMM architecture is disclosed in U.S. Pat. Nos. 7,289,386, 7,532,537, 7,619,912, and 7,636,274, each of which is incorporated in its entirety by reference herein. One of the main topological differences between the 3DS-DIMM and HCDIMM architectures is that while the 3DS-DIMM architecture uses a control die 722 to buffer the data signals and to decode command/address signals from the 3DS register, certain configurations of the HCDIMM architecture include a plurality of isolation devices (ID), each of which includes data buffers, but no decoding capability. Unlike the HCDIMM architecture, since the command/address signal needs to pass through the control die 722 in the 3DS DRAM package 720, the 3DS-DIMM proposal presents the same shortcoming (b) of the controller die described above. The data path control signals are generated by the register device (RD) 612 in the HCDIMM architecture 602, while the data path control signals are generated by the control die 722 in the 3DS DRAM. This aspect of the 3DS-DIMM architecture creates timing critical control paths in 3DS-DIMM architecture.

Figure 8:
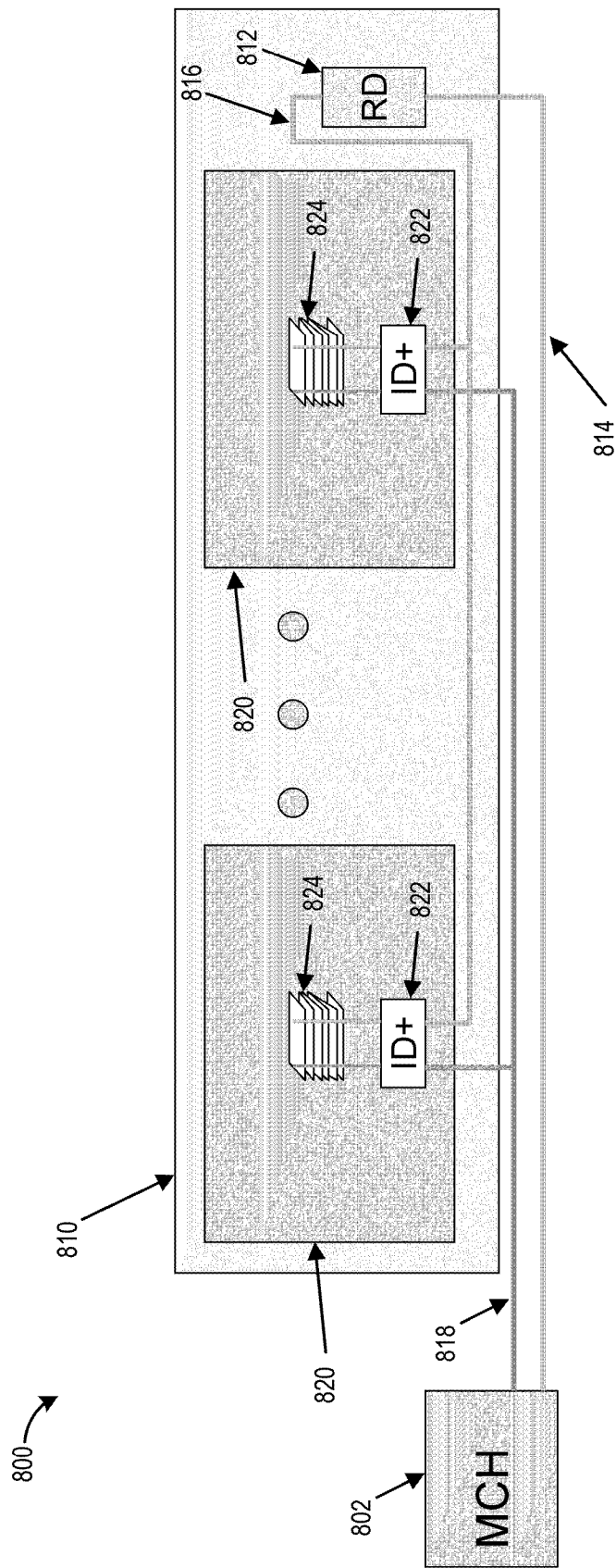
FIG. 8 schematically illustrates an example embodiment of a memory module architecture in accordance with the present disclosure.

In certain embodiments described herein, a memory module architecture is proposed that includes a set of device components that support JEDEC 3DS operation with the benefit of RDIMM and HCDIMM architectures (see, e.g., FIG. 8). This set of device components may comprise two components: a register device 812 (RD), which in some embodiments may be the same or similar RD component as used in HCDIMM architectures, and a plurality of array dies 824, such as a DDR DRAM Stack Package (DDSP). The DDSP may comprise a DRAM control die that can include command/address buffers and a data path control circuit. Certain embodiments of the architecture described herein differs from the 3DS-DIMM architecture in that instead of the controller die of the 3DS-DIMM (which provides a secondary address buffer, and a second rank multiplication decoder), certain embodiments described herein use an "ID+" die as a control die 822, which can provide both selective isolation and address pass-through. Selective isolation refers generally to a driver corresponding to an array die driving a signal to the array die in response to a corresponding chip select signal while additional drivers corresponding to additional array dies maintain a previous state (e.g. do not drive the signal). For example, assuming that the memory package 300 implements selective isolation, if a chip select signal is received that corresponds to a selection of array die 310b, then the driver 334a will drive a signal along the die interconnect 320a to the array die 310b, and the remaining drivers (e.g., drivers 334b-334f) will maintain their state (e.g., not drive the signal). Address pass-through is described in further detail below.

The data path control circuit of certain embodiments may have at least two operational modes: mode-C (HCDIMM/RDIMM Compatible mode) and mode-3DS (3DS DIMM compatible mode). In mode-C, the array dies 824 (e.g. a DDSP) receive the data path control signals from the register device 812, which can be configured to control a command/address time slot and a data bus time slot. In mode-3DS, the control die 822 internally generates the data path control signals to ensure the proper operation of the data path.

The control die 822 of certain embodiments enables the memory module 800 to work as either a 3DS-DIMM, a RDIMM, or a HCDIMM. However, the memory module 800 may comprise a set of optional control input pins (in addition to the package pins that are included in 3DS-DRAM packages) which in mode-C receive the data path control signals from the register device 812.

As previously mentioned, FIG. 8 schematically illustrates an example embodiment of a memory module architecture 800 in accordance with the present disclosure. Advantageously, certain embodiments of the memory module architecture 800 address the shortcomings described above without adding complexity or latency, and without causing performance loss. The memory module architecture 800 includes a memory control hub 802 (also known as a memory controller hub, a memory control handler, or a northbridge) and a memory module 810. As schematically illustrated in FIG. 8, the memory control hub 802 may communicate directly with one or more components of the memory module 810. Alternatively, the memory control hub 802 may communicate with one or more intermediary system components (not shown), which in turn communicate with one or more components of the memory module 810. In some embodiments, the memory control hub 802 may be integrated with another component of the computer system, such as a Central Processing Unit (CPU).

Further, in some embodiments, the memory control hub 802 may communicate with one or more memory modules. Each of the memory modules may be similar or substantially similar to the memory module 810. Alternatively, some of the memory modules may differ from memory module 810 in configuration, type, or both. For example, some of the memory modules may be capable of operating at different frequencies, may include a different amount of storage capability, or may be configured for different purposes (e.g. graphics versus non-graphics memory). Although in some cases a system may include memory modules capable of operating at different frequencies, each memory module may be configured to operate at the same frequency when used in a specific device. In certain implementations, the memory control hub 802 may set the operating frequency for the one or more memory modules.

The memory module 810 may include a register device 812, which is configured to receive command, address, or command and address signals from the memory control hub 802. For the purpose of simplifying discussion, and not to limit these signals, the signals will be referred to herein as command/address signals.

In some embodiments, the register device 812 receives the command/address signals via a command/address bus 814. The command/address bus 814, although illustrated as a single line, may include as many lines or signal conduits as the number of bits of the command/address signal.

Further, the register device 812 may generate data path control signals, which can be provided to a control die 822, or isolation device, of a memory package 820 via one or more data path control lines 816. In certain embodiments, the control dies 822 can include some or all of the embodiments described above with respect to the control dies 230 and 330. Moreover, in certain embodiments, the memory packages 820 can include some or all of the embodiments described above with respect to the memory package 200 and 300. In general, the memory module 812 may include one or more memory packages 820.

In certain embodiments, each control die 822, or isolation device, may be capable of address pass-through. Address pass-through, in some cases, enables the control die 822 to provide an address signal to one or more array dies 824 without decoding the address signal. This is possible, in some implementations, because the address signal received by the control die 822 is not encoded.

Some implementations of the control dies 822 include a plurality of command/address buffers (not shown). These buffers may comprise latches. In certain embodiments, the buffers are configured to hold command/address signals to control the timing of command/address signals. In some cases, controlling the timing of the command/address signals may reduce or slow signal degradation. In some implementations, the control dies 822 include a plurality of data buffers, which may control the timing of data signals to reduce or slow signal degradation. Further, the control dies 822 may include a data path control circuit (not shown) that is configured to control command/address time slots and data bus time slots. Controlling the command/address time slots and the data bus time slots enables the control dies 822 to reduce or prevent signal collisions caused by multiple memory packages 820 sharing the data path control lines 816 and the data bus 818. In some implementations, the data path control circuit may be separate from the control die 822.

Each of the control dies 822 may be configured to receive data signals from the memory control hub 802 via the data bus 818. Further, the control dies 822 may provide data signals to the memory control hub 802 via the data bus 818. The control dies 822 may also receive data path control signals and/or command/address signals from the register device 812 via the data path control lines 816.

As illustrated in FIG. 8, each memory package 820 may include one or more array dies 824 operatively coupled to the control die 822. The array dies 824 may be configured to receive data signals from the control die 822. As with the array dies 210 and 310, the array dies 824 may include any type of Random Access Memory (RAM) die. For example, the array dies 824 may include DDR DRAM, SDRAM, flash memory, or SRAM, to name a few. Further, if the memory module 810 is utilized for graphics, the array dies 824 may include GDDR SDRAM or any other type of graphics memory. In addition, the array dies 824 may be configured in a stack arrangement as illustrated in FIG. 8. Alternatively, the array dies 824 may be arranged in a planar configuration or a hybrid configuration utilizing both a planar and a stack arrangement.

In some embodiments, the memory module 810 is selectively configurable into two operational modes. In the first operational mode, the register device 812 generates data path control signals provided to the control dies 822 via the data path control lines 816. The control dies 822 may decode command/address signals included with the data path control signals generated by the register device 812. In some implementations, the control dies 822 use the data path control signals to operate the data path control circuits of the control dies 822.

In the second operational mode, the control dies 822 may operate the data path control circuits to provide command/address signals to the array dies 824 without decoding the command/address signals. In this mode, the control dies 822 may use address pass-through to provide received address signals to the array dies 824.

Other operational modes may also be possible. In some embodiments, the data path control signals generated by the register device 812 may include decoded command/address signals that are decoded from command/address signals received from the memory control hub 802 via the command/address bus 814.

In some embodiments, the register device 812 may be configured to perform rank multiplication. In addition, or alternatively, the control dies 822 may be configured to perform rank multiplication. Embodiments of rank multiplication are described in greater detail in U.S. Pat. Nos. 7,289,386 and 7,532,537, each of which are incorporated in their entirety by reference herein. In such embodiments, the register device 812 can generate additional chip select signals that are provided to the array dies 824. For instance, if the memory control hub 802 is configured to recognize a single array die 824 per memory package 820, but there exists four array dies 824 per memory package 820, the memory control hub 802 may not provide the correct number of chip select signals to access a specific memory location of the plurality of array dies 824 is memory package 820. Thus, to access the specific memory location, the register device 812 can determine the array die that includes the specific memory location to be accessed based on the command/address signals received from the memory control hub 802 and can generate the correct chip select signal to access the array die that includes the specific memory location. In certain embodiments, when the memory module 810 is operating in the second operation module as described above, the memory module 810 does not perform rank multiplication.

Terminology

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein,"

"above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A memory package, comprising:
    a plurality of input/output terminals via which the memory package communicates data and control/address signals with one or more external devices;
    a plurality of stacked array dies including a first group of array dies and a second group of at least one array die, each array die having data ports;
    at least a first die interconnect and a second die interconnect, the first die interconnect in electrical communication with the first group of array dies and not in electrical communication with the second group of at least one array die, the second die interconnect in electrical communication with the second group of at least one array die and not in electrical communication with the first group of array dies; and
    a control die comprising at least a first data conduit between the first die interconnect and a first terminal of the plurality of input/output terminals, and at least a second data conduit between the second die interconnect and the first terminal, the first terminal being a data terminal, the control die further comprising a control circuit to control respective states of the first data conduit and the second data conduit in response to control signals received via one or more second terminals of the plurality of terminals.

2. The memory package of claim 1, wherein the control signals include data path control signals for controlling the first and second data conduits.

3. The memory package of claim 1, wherein the control circuit is configured to generate data path control signals for controlling the first and second data conduits in response to the received control signals.

4. The memory package of claim 3, wherein the control signals include command/address signals and wherein the control die is configured to provide the command/address signals to the plurality of stacked array dies.

5. The memory package of claim 1, wherein the first die interconnect comprises a first through-silicon via and wherein the second die interconnect comprises a second through-silicon via.

6. The memory package of claim 1, wherein the control die further comprises chip-select conduits, the memory package further comprising:
    third die interconnects coupled between respective chip-select conduits and respective ones of the plurality of stacked array dies.

7. The memory package of claim 1, wherein a first number of array dies in the first group of array dies and a second number of at least one array die in the second group of at least one array die are selected in consideration of a load of the first die interconnect and a load of the second die interconnect so as to reduce a difference between a first load on the first data conduit and a second load on the second data conduit, the first load including a load of the first die interconnect, and a load of the first group of array dies, and the second load including a load of the second die interconnect and a load of the second group of at least one array die.

8. The memory package of claim 1, wherein the respective states of the first data conduit and the second data conduit are controlled by one or more data path control signals, wherein the control die is configurable to operate in any one of a first mode and a second mode, and wherein:
    in the first mode, the control die receives the data path control signals from the one or more external devices; and
    in the second mode, the control die generates the data path control signals from at least some of the control/address signals received from the one or more external devices.

9. The memory package of claim 1, wherein the control die further comprises command/address conduits configured to provide corresponding command/address signals to the array dies, the command/address signals including at least one memory cell address.

10. The memory package of claim 1, wherein the control die further comprises one or more additional conduits configured to provide one or more of a supply voltage signal and a ground signal to the array dies.

11. A memory package, comprising:
a plurality of input/output terminals via which the memory package communicates data and control/address signals with one or more external devices;
a plurality of array dies arranged in a stack, including a first group of array dies and a second group of at least one array die;
at least a first die interconnect and a second die interconnect, the first die interconnect in electrical communication with the first group of array dies and not in electrical communication with the second group of at least one array die, the second die interconnect in electrical communication with the second group of at least one array die and not in electrical communication with the first group of array dies; and
a control die comprising at least a first data conduit between the first die interconnect and a first terminal of the plurality of input/output terminals, at least a second data conduit between the second die interconnect and the first terminal, and chip select conduits for providing chip select signals to respective array dies;
wherein the control die further comprises a control circuit to control respective states of the first data conduit and the second data conduit to drive a data signal to an array die selected by at least one of the chip-select signals.

12. The memory package of claim 11, wherein the chip select conduits pass through the control die.

13. The memory package of claim 11, wherein the chip select conduits include drivers to drive the chip select signals to the respective array dies.

14. The memory package of claim 11, wherein the first die interconnect comprises one or more through silicon vias and wherein the second die interconnect comprises one or more through silicon vias.

15. The memory package of claim 11, wherein: the first data conduit comprises at least a first driver having a first driver size, and the second data conduit comprises at least a second driver having a second driver size, and wherein the first driver size and the second driver size are both less than a driver size sufficient to drive a signal along a die interconnect in electrical communication with each of the plurality of array dies without significant signal degradation.

16. The memory package of claim 11, wherein the control die is configured to generate the chip select signals from control signals received via second terminals of the plurality of terminals, and wherein the chip select signal is generated using an address signal in the control/address signals.

17. The memory package of claim 11, wherein the control circuit controls the respective states of the first data conduit and the second data conduit in response to at least some of the control/address signals received via second terminals of the plurality of terminals.

18. The memory package of claim 16, wherein the control/address signals comprise: at least one command signal, at least one address signal, and at least one data path control signal.

19. The memory package of claim 11, wherein the control die is configured to generate data path control signals from the control/address signals received via second terminals of the plurality of terminals, and wherein the control circuit controls the respective states of the first data conduit in response to the data path control signals.

20. A method for optimizing load in a memory package comprising a plurality of array dies arranged in a stack and including a first group of array dies and a second group of at least one array die, at least a first die interconnect and a second die interconnect, a control die, and a plurality of input/output terminals via which the memory package communicates data and control/address signals with one or more external devices, the method comprising:
receiving a data signal at a first terminal of the plurality of input/output terminals;
receiving control signals at second terminals of the plurality of input/output terminals;
providing chip select signals to respective array dies through the control die, the chip select signals being related to at least some of the control signals; and
selecting one of a first driver and a second driver in the control die to drive the data signal via a corresponding one of the first die interconnect and the second die interconnect to an array die selected by at least one of the chip select signals, the first die interconnect in electrical communication with the first group of array dies and not in electrical communication with the second group of at least one array die, the second die interconnect in electrical communication with the second group of at least one array die and not in electrical communication with the first group of array dies.

21. The method of claim 20, further comprising:
selecting a first driver size for the first driver based, at least in part, on a load on the first driver; and
selecting a second driver size for the second driver based, at least in part, on a load on the second driver.

22. The method of claim 21, wherein the first driver size and the second driver size are both less than a driver size sufficient to drive a signal along a die interconnect in electrical communication with each of the plurality of array dies without significant signal degradation.

23. The method of claim 20, further comprising generating the chip select signals from at least some of the control signals.

24. The method of claim 20, wherein the control signals include the chip-select signals.

25. The method of claim 20, wherein the first and second die interconnects each comprises at least one through silicon vias.

26. The method of claim 20, wherein the chip select signals pass through through-silicon-vias in the control die.

27. The method of claim 20, further comprising generating data path control signals from at least some of the control signals, the data path control signals being used to select the one of the first driver and the second driver in the control die to drive the data signal.

28. The method of claim 20, wherein the one of the first driver and the second driver is selected using at least some of the control signals.

29. A memory module operable via a memory control hub, comprising:
a register device configured to receive command/address signals from the memory control hub and to generate control signals; and
a plurality of DRAM packages, each DRAM package comprising:
a plurality of data terminals via which the DRAM package communicates data with the memory control hub, and a plurality of control terminals to receive the control signals;
a plurality of array dies arranged in a stack, including a first group of array dies and a second group of at least one array die;
at least a first die interconnect and a second die interconnect, the first die interconnect in electrical communication with the first group of array dies and not in electrical communication with the second group of at least one array die, the second die interconnect in electrical communication with the second group of at least one array die and not in electrical communication with the first group of array dies; and a control die comprising at least a first data conduit between the first die interconnect and a first data terminal of the plurality of data terminals, at least a second data conduit between the second die interconnect and the first data terminal, and chip select conduits for providing chip select signals to respective array dies, the chip select signals being related to at least some of the control signals;

wherein the control die further comprises a control circuit to control respective states of the first data conduit and the second data conduit to drive a data signal to an array die selected by at least one of the chip-select signals.

30. The memory module of claim 29, wherein the register device is further configured to perform rank multiplication by generating the chip select signals, and wherein the control signals include the chip select signals.

31. The memory module of claim 29, wherein the control signals include data path control signals generated by the register device, the data path control signals being used to control the respective states of the first data conduit and the second data conduit.

32. The memory module of claim 29, wherein the control die is further configured to perform rank multiplication by generating the chip select signals from at least some of the control signals that include at least one address signal.

33. The memory module of claim 29, wherein the control signals include command/address signals, and the control die is configured to hold the command/address signals to control timing of the command/address signals.

34. The memory module of claim 29, wherein the control die is configured to generate data path control signals from at least some of the control signals, the data path control signals being used to control the respective states of the first data conduit and the second data conduit.

\* \* \* \* \*